United States Patent
Nam et al.

(10) Patent No.: US 9,478,290 B1
(45) Date of Patent: Oct. 25, 2016

(54) MEMORY DEVICE AND MEMORY SYSTEM INCLUDING THE SAME

(71) Applicant: SAMSUNG ELECTRONICS CO., LTD., Suwon-Si, Gyeonggi-Do (KR)

(72) Inventors: Sang-Wan Nam, Hwaseong-si (KR); Kyung-Hwa Kang, Seoul (KR); Dae-Seok Byeon, Seongnam-si (KR); Chi-Weon Yoon, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/938,394

(22) Filed: Nov. 11, 2015

(30) Foreign Application Priority Data

Jul. 2, 2015 (KR) ......................... 10-2015-0094937

(51) Int. Cl.
| G11C 16/00 | (2006.01) |
|---|---|
| G11C 16/04 | (2006.01) |
| G11C 16/08 | (2006.01) |
| G11C 16/24 | (2006.01) |
| G11C 16/26 | (2006.01) |

(52) U.S. Cl.
CPC ........... *G11C 16/0483* (2013.01); *G11C 16/08* (2013.01); *G11C 16/24* (2013.01); *G11C 16/26* (2013.01)

(58) Field of Classification Search
CPC ... G11C 16/0483; G11C 16/08; G11C 16/24; G11C 16/26
USPC ............. 365/63, 185.05, 185.11, 185.17, 365/185.18, 185.23, 230.06
See application file for complete search history.

(56) References Cited

U.S. PATENT DOCUMENTS

| 8,027,197 | B2 | 9/2011 | Shim et al. | |
|---|---|---|---|---|
| 8,107,289 | B2 | 1/2012 | Shim et al. | |
| 8,320,181 | B2 | 11/2012 | Violette | |
| 8,593,865 | B2* | 11/2013 | Kim ......................... | G11C 5/02 365/185.11 |
| 8,897,070 | B2 | 11/2014 | Dong et al. | |
| 8,913,433 | B2 | 12/2014 | Kim et al. | |
| 8,923,050 | B2 | 12/2014 | Cernea et al. | |
| 8,976,591 | B2 | 3/2015 | Nam et al. | |
| 9,030,869 | B2 | 5/2015 | Yun et al. | |
| 2009/0168533 | A1* | 7/2009 | Park ........................ | G11C 5/02 365/185.17 |
| 2010/0002516 | A1* | 1/2010 | Sim ......................... | G11C 5/02 365/185.17 |

(Continued)

FOREIGN PATENT DOCUMENTS

| KR | 1020120000900 | 1/2012 |
|---|---|---|
| KR | 10-1212678 | 12/2012 |
| KR | 1020130021195 | 3/2013 |
| KR | 10-1502584 | 3/2015 |

*Primary Examiner* — Tan T. Nguyen
(74) *Attorney, Agent, or Firm* — F. Chau & Associates, LLC

(57) ABSTRACT

A memory device is provided as follows. A memory cell array includes strings including first and second strings. Each string includes a ground selection transistor and cell transistors. First and second ground selection lines are connected to a gate of a first ground selection transistor of the first string and a gate of a second ground selection transistor of the second string, respectively. First and second cell gate lines are connected to a gate of a first cell transistor of the first string and a gate of a second cell transistor of the second string, respectively. A first interconnection unit electrically connects a first portion of the first cell gate line to a first portion of the second cell gate line. A second interconnection unit electrically connects a second portion of the first cell gate line to a second portion of the second cell gate line.

29 Claims, 32 Drawing Sheets

(56) References Cited

U.S. PATENT DOCUMENTS

| | | | |
|---|---|---|---|
| 2015/0009760 A1* | 1/2015 | Nam | G11C 16/0483 365/185.18 |
| 2015/0063033 A1 | 3/2015 | Dong et al. | |
| 2015/0187422 A1* | 7/2015 | Aritome | G11C 5/02 365/185.17 |

* cited by examiner

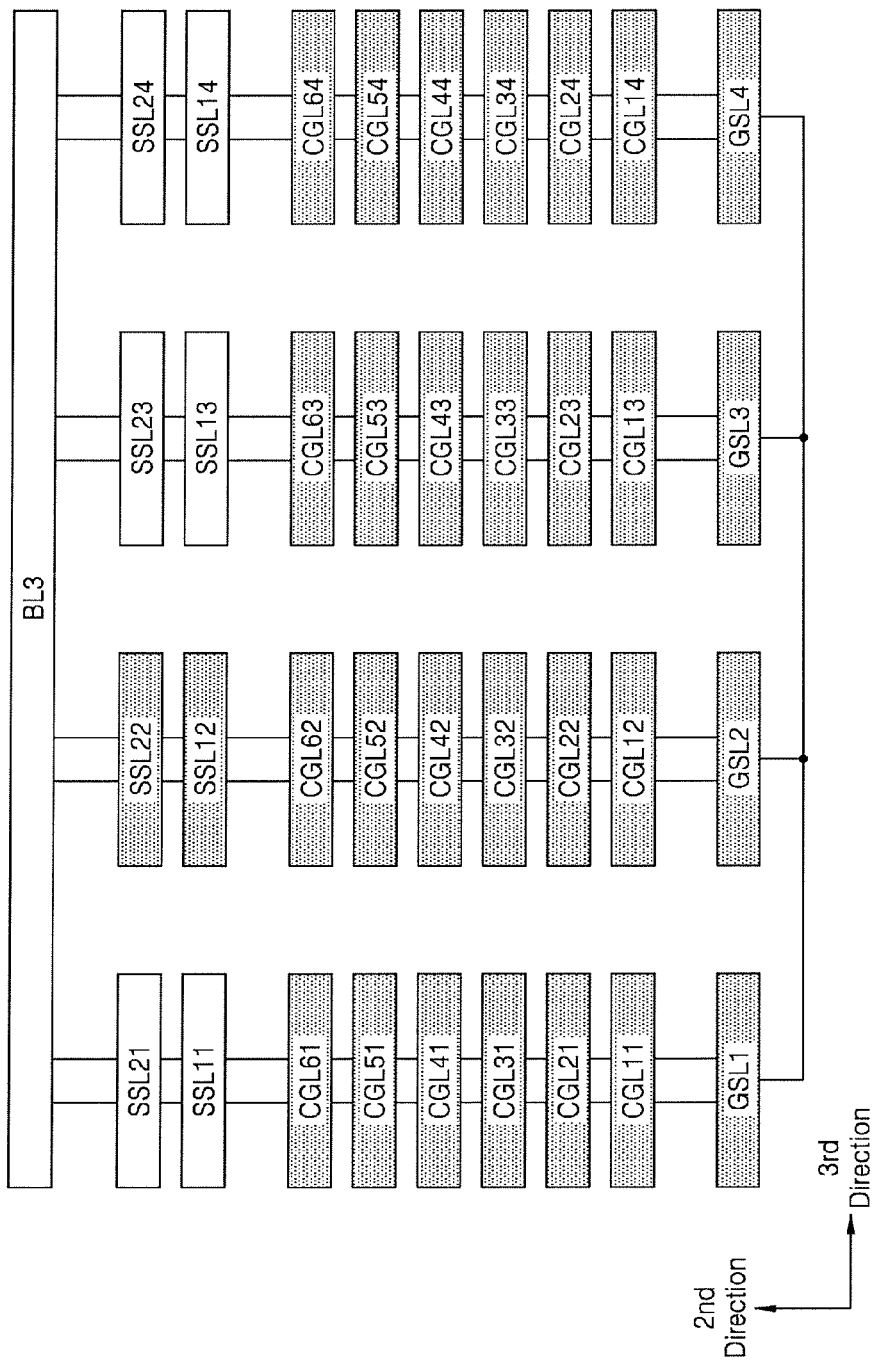

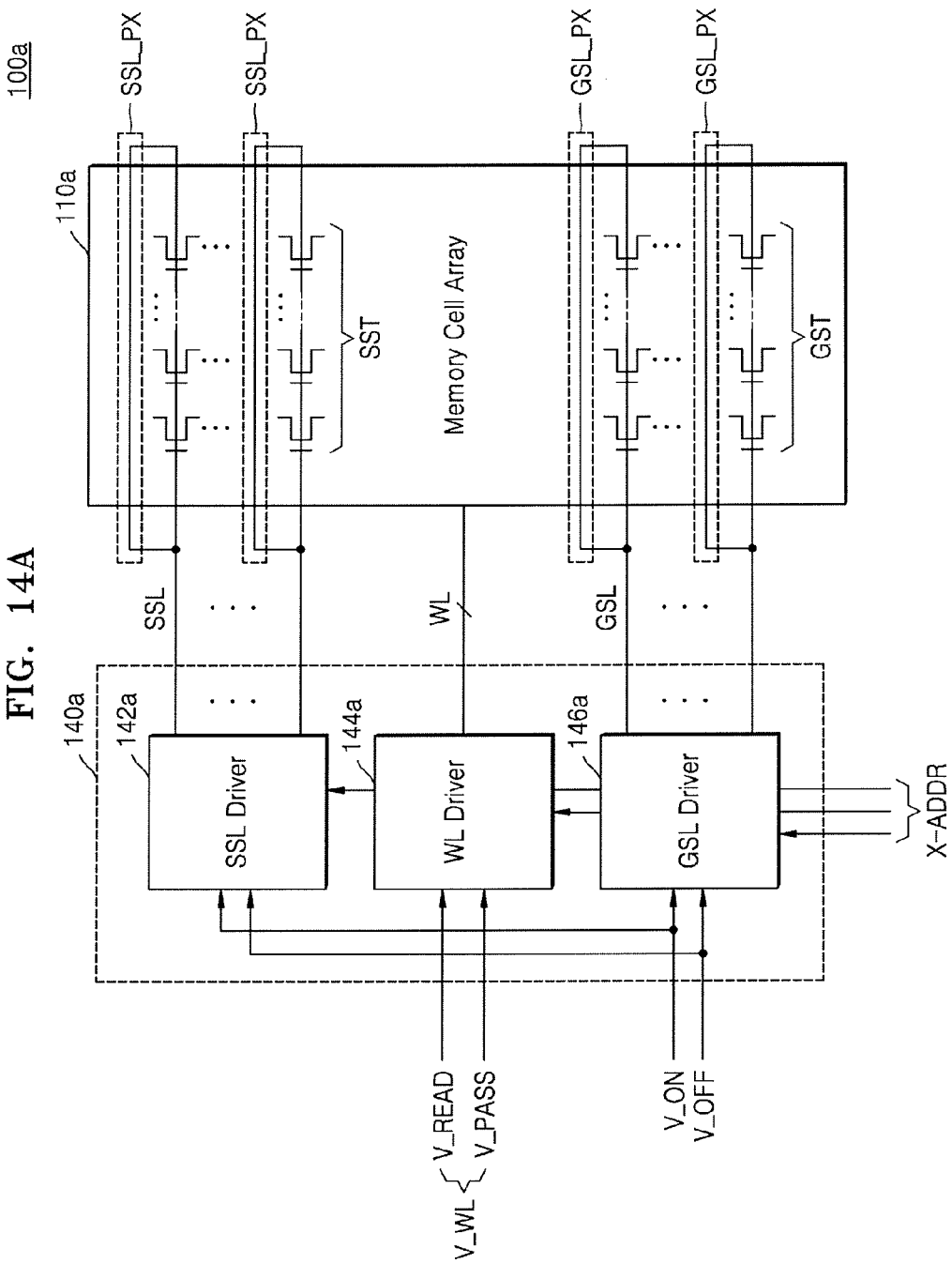

MEMORY DEVICE AND MEMORY SYSTEM INCLUDING THE SAME

CROSS-REFERENCE TO RELATED APPLICATION

This application claims priority under 35 U.S.C. §119 to Korean Patent Application No. 10-2015-0094937, filed on Jul. 2, 2015, in the Korean Intellectual Property Office, the disclosure of which is incorporated by reference herein in its entirety.

TECHNICAL FIELD

The inventive concept relates to a memory device and a memory system including the same.

DISCUSSION OF RELATED ART

Memory devices storing data may be categorized as either volatile memory devices or non-volatile memory devices. A flash memory device, which is an example of a non-volatile memory device, may be used for mobile phones, digital cameras, personal digital assistants (PDAs), mobile computer devices, fixed computer devices, and other devices.

SUMMARY

According to an exemplary embodiment of the present inventive concept, a memory device is provided as follows. A memory cell array includes a plurality of strings including a first string and a second string. Each string includes a ground selection transistor and a plurality of cell transistors vertically stacked on a substrate. First and second ground selection lines are connected to a gate of a first ground selection transistor of the first string and a gate of a second ground selection transistor of the second string, respectively. The first and the second ground selection lines are electrically insulated from each other. First and second cell gate lines are connected to a gate of a first cell transistor of the first string and a gate of a second cell transistor of the second string, respectively. A first interconnection unit having a first patterned conducive layer electrically connects a first portion of the first cell gate line to a first portion of the second cell gate line. A second interconnection unit having a second patterned conducive layer electrically connects a second portion of the first cell gate line to a second portion of the second cell gate line.

According to an exemplary embodiment of the present inventive concept, a memory device is provided as follows. A memory cell array includes strings including a first string and a second string. Each string includes a ground selection transistor and a plurality of cell transistors vertically stacked in at least one levels on a substrate. First and second ground selection lines are connected to a gate of first ground selection transistor of the first string and to a gate of a second ground selection transistor of the second string, respectively. The first and the second ground selection lines are electrically insulated from each other. A row decoder generates a word line driving voltage. The row decoder applies a selection voltage to one of the first and the second ground selection lines, and a non-selection voltage to the other. The word line driving voltage is transmitted through first and second paths to the cell transistors of each string. The cell transistors of each string are disposed at a first level.

According to an exemplary embodiment of the present inventive concept, a memory system is provided as follows. A memory cell array includes strings including a first string and a second string. Each string includes a ground selection transistor and a plurality of cell transistors vertically stacked in at least one levels on a substrate. First and second ground selection lines are connected to a gate of first ground selection transistor of the first string and to a gate of a second ground selection transistor of the second string, respectively. The first and the second ground selection lines are electrically insulated from each other. A row decoder generates a word line driving voltage. The row decoder applies a selection voltage to one of the first and the second ground selection lines, and a non-selection voltage to the other. The word line driving voltage is transmitted through first and second paths to the cell transistors of each string. The cell transistors of each string are disposed at a first level. A memory controller controls the memory device in response to an externally received request.

According to an exemplary embodiment of the present inventive concept, a memory device is provided as follows. A first ground selection line, a first cell gate line, and a first string selection line are stacked vertically on each other on a substrate. The first ground selection line, the first cell gate line, and the first string selection line are extended along a first direction. A first conductive line connects electrically both ends of the first cell gate line. A first ground selection line connection connects electrically both ends of the first ground selection line. A first string selection line connection connects electrically both ends of the first string selection line. A row decoder is electrically connected to the first cell gate line, the first conductive line, the first ground selection line, the first ground selection line, the first string selection line and the first string selection line.

BRIEF DESCRIPTION OF THE DRAWINGS

These and other features of the inventive concept will become more apparent by describing in detail exemplary embodiments thereof with reference to the accompanying drawings of which:

FIGS. 8A and 8B are schematic cross-sectional views taken along line X1-X1' of FIG. 5, according to an exemplary embodiment of the present inventive concept;

FIGS. 14A and 14B illustrate a memory device including a first memory block corresponding to the circuit diagram shown in FIG. 13 according to an exemplary embodiment of the present inventive concept;

Figure 1:
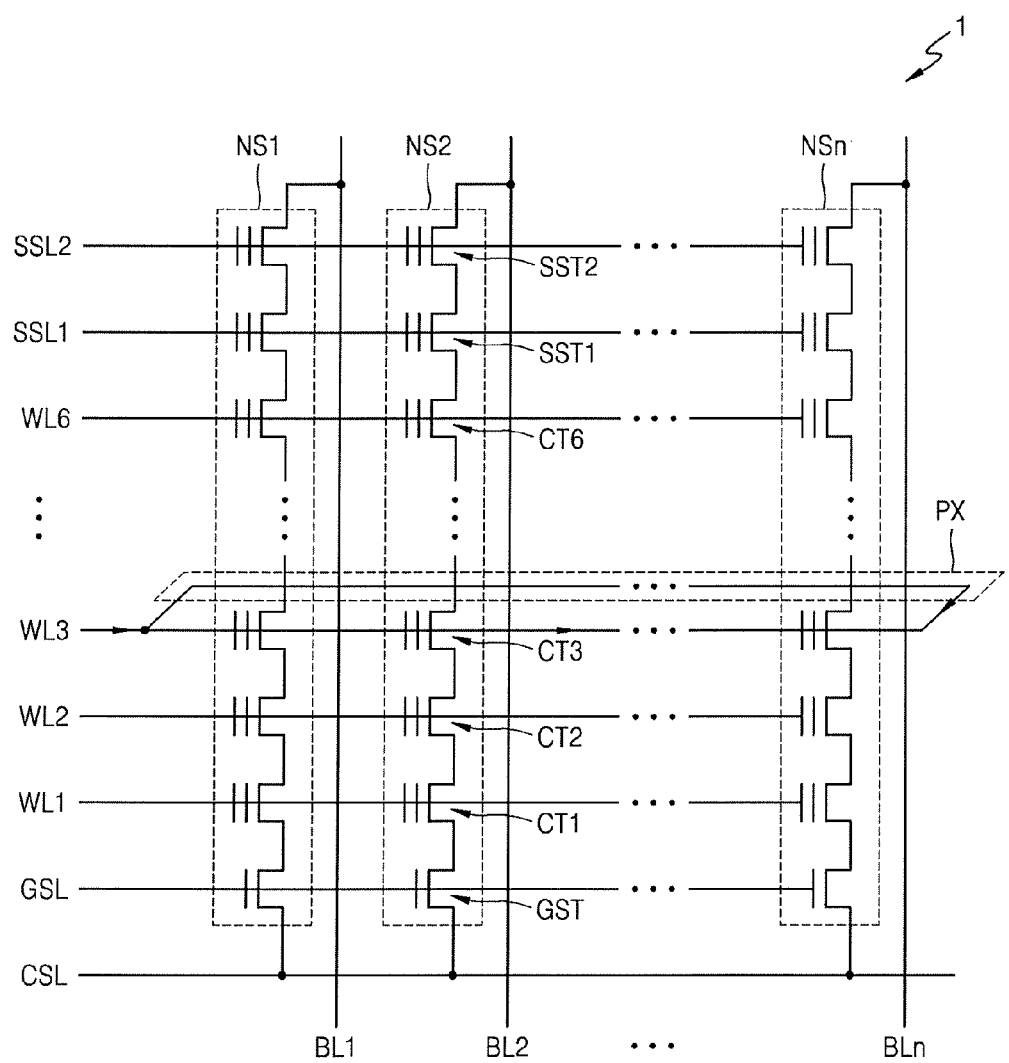
FIG. 1 is a circuit diagram of a memory cell array included in a memory device according to an exemplary embodiment of the present inventive concept.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

DETAILED DESCRIPTION OF EXEMPLARY EMBODIMENTS

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

FIG. 1 is a circuit diagram of an example of a memory cell array 1 included in a memory device according to an exemplary embodiment. Referring to FIG. 1, the memory cell array 1 may include a plurality of transistors. A plurality of bit lines (e.g., BL1 to BLn), a plurality of word lines (e.g., WL1 to WL6), and selection lines (e.g., SSL1, SSL2, and GSL) may be arranged on the memory cell array 1.

The memory cell array 1 may include a plurality of strings NS1 to NSn, each of which may include a plurality of cell transistors CT1 to CT6 connected in series. Each of the cell transistors CT1 to CT6 may have a state (e.g., a threshold voltage) corresponding to data stored therein. Each of the strings NS1 to NSn may include not only the plurality of cell transistors CT1 to CT6 but also a plurality of additional transistors (e.g., SST1, SST2, and GST) configured to support an operation of writing data to one of the plurality of cell transistors CT1 to CT6 or an operation of reading data from one of the plurality of cell transistors CT1 to CT6. For example, the string NS2 may include string selection transistors SST1 and SST2, which are respectively connected to the cell transistor CT6 disposed at one end of a series of cell transistors CT1 to CT6 and the bit line BL2, and a ground selection transistor GST, which is connected to the cell transistor CT1 disposed at the other end of the series of cell transistors CT1 to CT6 and a common source line CSL.

Gates of the cell transistors CT1 to CT6 may be respectively connected to the word lines WL1 to WL6, and gates of the string selection transistors SST1 and SST2 may be respectively connected to the string selection lines SSL1 and SSL2. A gate of the ground selection transistor GST may be connected to a ground selection line GSL. The string selection transistors SST1 and SST2, the cell transistors CT1 to CT6, and the ground selection transistor GST included in the strings NS1 to NSn may be respectively controlled in response to signals applied to the string selection lines SSL1 and SSL2, the word lines WL1 to WL6, and the ground selection line GSL.

The strings NS1 to NSn may be arranged on the memory cell array 1 and spaced different distances apart from a signal source (e.g., a row decoder 140 to be described below with reference to FIG. 2). Thus, times taken for signals to reach gates of transistors included in each of the strings NS1 to NSn may be different. For example, as shown in FIG. 1, when a signal is applied from a left side of the memory cell array 1 to a plurality of gate lines, a signal applied to a second word line WL2 may reach a cell transistor, which is included in the string NSn and has a gate connected to the second word line WL2, later than a cell transistor, which is included in the string NS1 and has a gate connected to the second word line WL2. For example, the cell transistor included in the string NSn may receive a signal that is delayed with respect to the cell transistor included in the string NS1. As a resistance of the second word line WL2 and a capacitance formed by the second word line WL2 increase, a delay time of the signal may further increase. The delay time of the signal may lead to a reduction in operation speed of the memory device including the memory cell array 1. For example, the memory device may be configured to operate based on the maximum delay time, thereby resulting in a reduction in operating speed of the memory device.

According to an exemplary embodiment, the memory cell array 1 may include cell transistors configured to receive signals applied to the word lines WL1 to WL6 through at least two paths including a first path and a second path. Referring to FIG. 1, a cell transistor that is included in the string NSn and connected to the third word line WL3 may receive signals not only through a first path having a portion of the third word line WL3 connected to other strings NS1 and NS2, which may share the string selection lines SSL1 and SSL2 and the ground selection line GSL1 with the string NSn, but also through a second path PX. The second path PX may include a conductive line through which signals may be transmitted. A signal applied to the third word line WL3 may rapidly reach the cell transistor, which is included in the string NSn, through the second path PX, and the operating speed of the memory device including the memory cell array 1 may be improved. Also, even if failures occur, for example, even if a portion of the third word line WL3 is cut or a resistance of the third word line WL3 becomes high, signals may be applied to the cell transistor through a different path from a path in which failures occur.

FIG. 1 illustrates an example of the memory cell array 1 in which one string includes two string selection transistors SST1 and SST2 and one ground selection transistor GST, but the inventive concept is not limited thereto. For example, a string included in the memory cell array 1 may include string selection transistors and ground selection transistors in different numbers from the string selection transistors SST1 and SST2 and the ground selection transistor GST shown in FIG. 1. Also, the plurality of cell transistors CT1 to CT6 included in each string may include a plurality of memory cells and at least one dummy cell. The dummy cell may be disposed in each of both ends of the plurality of memory cells connected in series. For example, a first dummy cell may be interposed between a memory cell associated with a first word line WL1 and a ground selection transistor associated with a global selection line GSL; a second dummy cell may be interposed between a memory cell associated with a sixth word lien WL6 and a string selection transistor associated with a first string selection transistor SSL1. The dummy cell may serve to prevent undesired influence on each of the memory cells during the programming or erasing of each of the memory cells. For example, the dummy cell may reduce the influence of a potential difference between each of the memory cells and the bit line BL or a potential difference between each of the memory cells and the common source line CSL. The dummy cell may be referred to as a dummy cell transistor.

Figure 2:
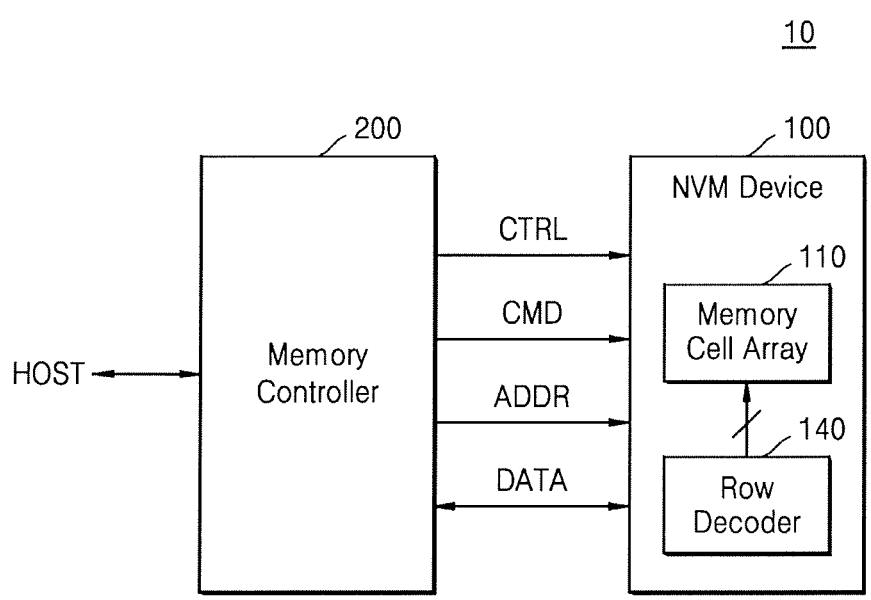
FIG. 2 is a schematic block diagram of a memory system according to an exemplary embodiment of the present inventive concept.

FIG. 2 is a schematic block diagram of a memory system 10 according to an exemplary embodiment. Referring to FIG. 2, the memory system 10 may include a memory device 100 and a memory controller 200. The memory device 100 may include a memory cell array 110 and a row decoder 140.

As described above with reference to FIG. 1, the memory cell array 110 may include a plurality of cell transistors. According to an exemplary embodiment, the memory cell array 110 may be a three-dimensional (3D) memory array. In an exemplary embodiment, the 3D memory array may be monolithically formed in one or more physical levels of arrays of cell transistors having an active area provided above a silicon substrate and circuitry associated with the operation of those cell transistors. Such associated circuitry may be formed above or within such substrate. The term "monolithic" means that layers of each level of the memory cell array 110 are directly deposited on the layers of each underlying level of the memory cell array 110.

The following patent documents, which are hereby incorporated by reference, describe a plurality of memory cells which are arranged in a plurality of levels to form a 3D memory array, with word lines and/or bit lines shared between levels: U.S. Pat. Nos. 7,679,133; 8,553,466; 8,654,587; 8,559,235; and US Pat. Pub. No. 2011/0233648.

According to an exemplary embodiment, a 3D memory array may include vertical NAND (VNAND) strings disposed in a vertical direction such that at least one cell transistor is located over another cell transistor, and at least one cell transistor may comprise a charge trap layer. For example, the plurality of cell transistors may be 3D VNAND flash memory cells. Hereinafter, exemplary embodiments will be described in detail on assumption that the plurality of cell transistors of the memory cell array 110 are NAND flash memory cells. In other exemplary embodiments, the plurality of cell transistors may be 2D planar NAND flash memory cells. However, the inventive concept is not limited thereto. In an exemplary embodiment, the plurality of cell transistors may be resistive memory cells of resistive RAM (RRAM), phase-change RAM (PRAM), or magnetic RAM (MRAM).

In an exemplary embodiment, each of the cell transistors included in the memory cell array 110 may store 2-bit data or more. In an exemplary embodiment, each of the cell transistors included in the memory cell array 110 may be a multi-level cell (MLC) configured to store 2-bit data. In an exemplary embodiment, each of the cell transistors included in the memory cell array 110 may be a triple-level cell (TLC) configured to store 3-bit data. Hereinafter, each of the cell transistors included in the memory cell array 110 will be described as a TLC, but the inventive concept is not limited thereto. For example, in exemplary embodiment, each of the cell transistors included in the memory cell array 110 may store 4-bit data or more. Also, each of the cell transistors included in the memory cell array 110 may be used as a single-level cell (SLC) configured to store 1-bit data.

The row decoder 140 may be connected to the memory cell array 110 through a plurality of gate lines and apply signals to the gate lines to control cell transistors included in the memory cell array 110 or other transistors. The signals provided by the row decoder 140 may be transmitted through the gate lines, and times taken for signals to reach the cell transistors included in the memory cell array 110 or other transistors may be different from one another.

According to an exemplary embodiment, the memory cell array 110 may include cell transistors configured to receive the signals provided by the row decoder 140 through at least two paths. Thus, the times taken for the signals provided by the row decoder 140 to reach the cell transistors may be reduced, and an operating speed of the memory device 100 may be improved. Also, even if failures occur, for example, even if a portion of a gate line (e.g., a word line) is open or a resistance of the gate line becomes high, a signal provided by the row decoder 140 may reach the cell transistor through a different path from a path in which failures occur. Thus, a failure rate of the memory device 100 may be reduced.

Although not shown, the memory controller 200 may include a random access memory (RAM), a processing unit, a host interface, and a memory interface. The RAM may be used as an operation memory for the processing unit, and the processing unit may control operations of the memory controller 200. The host interface may support a protocol configured to exchange data between a host HOST and the memory controller 200. As an example, the memory controller 200 may be configured to communicate with the outside (e.g., the host HOST) via at least one of various interface protocols, such as a universal serial bus (USB), a multimedia card (MMC), a peripheral component interconnection-express (PCI-E), an advanced technology attachment (ATA), a serial-ATA (SATA), a parallel-ATA (PATA), a small computer small interface (SCSI), an enhanced small disk interface (ESDI), and an integrated drive electronics (IDE).

Figure 3:
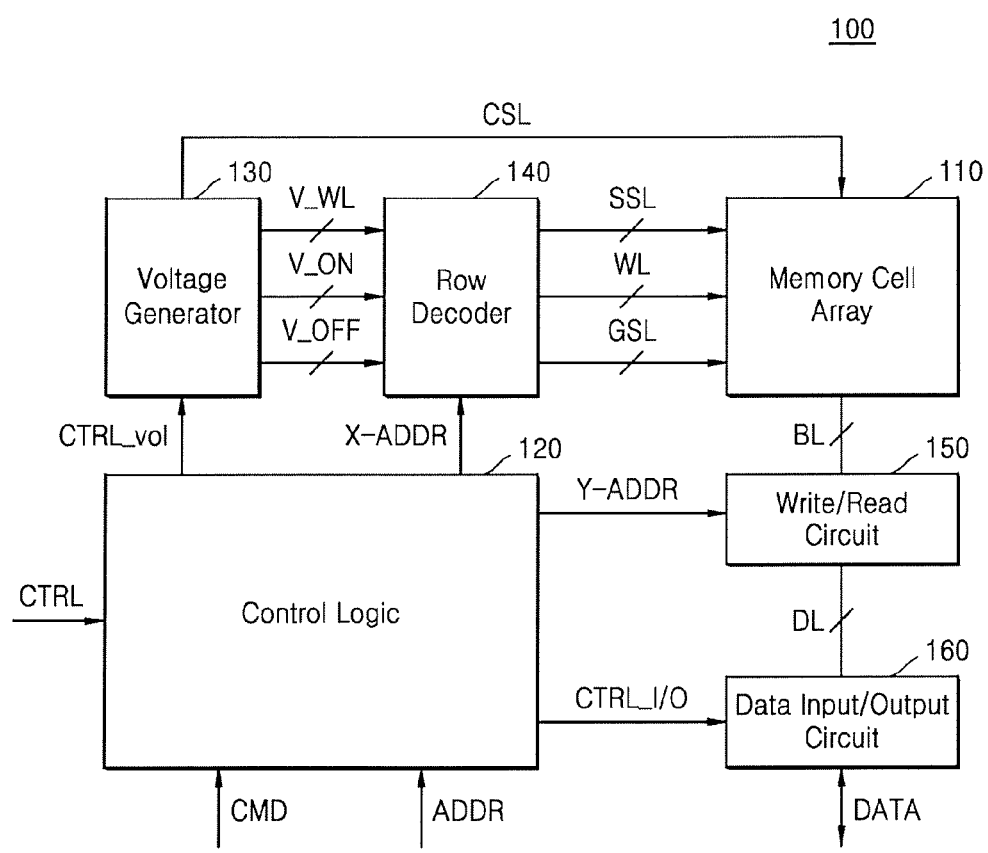
FIG. 3 is a block diagram of the memory device of FIG. 2 according to an exemplary embodiment of the present inventive concept.

FIG. 3 is a block diagram of the memory device 100 included in the memory system 10 of FIG. 2 according to an exemplary embodiment of the present inventive concept. Referring to FIG. 3, the memory device 100 may include a memory cell array 110, a control logic 120, a voltage generator 130, a row decoder 140, a write/read circuit 150, and a data I/O circuit 160. Hereinafter, elements included in the memory device 100 will be described in detail.

The memory cell array 110 may be connected to a plurality of gate lines and a plurality of bit lines BL. As shown in FIG. 3, the gate lines may include a plurality of word lines WL, a plurality of string selection lines SSL, and a plurality of ground selection lines GSL. The memory cell array 110 may include a plurality of cell transistors disposed at intersections between the word lines WL and the bit lines BL. Each of the cell transistors may store 1-bit data or multi-bit data. As described above, the memory cell array 110 may include a cell transistor configured to receive signals from the row decoder 140 through at least two paths. For example, at least one of the word lines WL may include at least two paths formed between the row decoder 140 and each of cell transistors disposed at the same level.

When an erase voltage is applied to the cell transistors of the memory cell array 110, the cell transistors may be put into an erase state. When a program voltage is applied to the cell transistors of the memory cell array 110, the cell transistors may be put into a program state. In this case, each of the cell transistors may have one of an erase state E and at least one program state, which are classified according to a threshold voltage Vth.

In an exemplary embodiment, when the cell transistor is a single-level cell, the cell transistor may have an erase state E and a program state P. In an exemplary embodiment, the cell transistor may have one of an erase state and a plurality of program states. For example, when the cell transistor is a multi-level cell, the cell transistor may have one of an erase state and three program states. In an exemplary embodiment, when the cell transistor is a triple-level cell, the cell transistor may have one of an erase state and seven program states.

The control logic 120 may output various internal control signals to store data in the memory cell array 110 or read data from the memory cell array 110, based on a command CMD, an address ADDR, and a control signal CTRL received from the memory controller 200. Thus, the control logic 120 may generally control various operations in the memory device 100. For example, the control logic 120 may include a processor and a memory configured to store commands performed by the processor. In an exemplary, the control logic 120 may be a hardware module, such as a finite state machine (FSM), which is triggered in response to, for example, a control signal CTRL or a command CMD.

The various internal control signals generated by the control logic 120 may be provided to the voltage generator 130, the row decoder 140, the write/read circuit 150, and the data I/O circuit 160. For example, the control logic 120 may provide a voltage control signal CTRL_vol to the voltage generator 130, provide a row address X_ADDR to the row decoder 140, provide a column address Y_ADDR to the write/read circuit 150, and provide an I/O control signal CTRL_I/O to the data I/O circuit 160. However, the inventive concept is not limited thereto, and the control logic 120 may further provide other internal control signals to the voltage generator 130, the row decoder 140, the write/read circuit 150, and the data I/O circuit 160.

The voltage generator 130 may generate various kinds of voltages for performing a program operation, a read operation, and an erase operation on the memory cell array 110, in response to the voltage control signal CTRL_vol. For example, the voltage generator 130 may generate a word line driving voltage V_WL for driving a plurality of word lines WL. In this case, the word line driving voltage V_WL may include a program voltage (or a write voltage), a read voltage, an erase voltage, an inhibition voltage, or a program verification voltage. Also, the voltage generator 130 may generate a selection voltage V_ON and a non-selection voltage V_OFF to drive the string selection lines SSL and the ground selection lines GSL. To select at least one of a plurality of strings included in the memory cell array 110, the selection voltage V_ON may be applied to a gate of a string selection transistor SST and/or a gate of a ground selection transistor GST included in a selected string. Although FIG. 3 illustrates an example in which the voltage generator 130 generates one selection voltage V_ON and one non-selection voltage V_OFF, the voltage generator 130 may generate a plurality of selection voltages and a plurality of non-selection voltage, and different selection voltages or non-selection voltages may be applied to the string selection lines SSL and the ground selection lines GSL.

The row decoder 140 may be connected to the memory cell array 110 through the word lines WL, the string selection lines SSL, and the ground selection lines GSL. The row decoder 140 may enable some of the word lines WL in response to a row address X-ADDR received from the control logic 120. For example, in a read operation, the row decoder 140 may apply a read voltage to a selected word line and apply a pass voltage to an unselected word line. Also, in a program operation, the row decoder 140 may apply a program voltage to a selected word line and apply an inhibition voltage to an unselected word line.

In addition, the row decoder 140 may enable some of the string selection lines SSL and some of the ground selection lines GSL in response to the row address X_ADDR received from the control logic 120. For example, during a read operation, the row decoder 140 may apply a selection voltage V_ON to a string selection line connected to the string selection transistor SST of a string including a selected cell transistor, and apply a non-selection voltage V_OFF to an unselected string selection line. Similarly, during the read operation, the row decoder 140 may apply a selection voltage V_ON to a ground selection line connected to the ground selection transistor GST of the string including the selected cell transistor, and apply a non-selection voltage V_OFF to an unselected ground selection line.

The write/read circuit 150 may be connected to the memory cell array 110 through the plurality of bit lines BL. The write/read circuit 150 may perform a program operation or a read operation in response to a column address Y_ADDR received from the control logic 120 and an internal control signal (not shown). For example, the write/read circuit 150 may include a sense amplifier, which may detect a state of memory cells of the memory cell array 110 and output the signal corresponding to the detected state during a read operation. Also, the write/read circuit 150 may include a page buffer and transmit a signal corresponding data DATA stored in the page buffer through bit lines BL during a write operation.

The data I/O circuit 160 may transmit input data DATA through the data lines DL to the write/read circuit 150 or transmit a signal, which is output from the write/read circuit 150, as data DATA through a plurality of input/output (I/O) pins or a data bus of the memory device 100 to the outside of the memory device 100 (e.g., the memory controller 200 of FIG. 2).

Although not shown in FIG. 3, the memory device 100 may include a multiplexer (not shown), which may be interposed between the memory cell array 110 and the write/read circuit 150 or between the write/read circuit 150 and the data I/O circuit 160. When the multiplexer is interposed between the memory cell array 110 and the write/read circuit 150, the multiplexer may be connected to the memory cell array 110 through the bit lines BL, and connect some of the bit lines BL with the write/read circuit 150 based on an internal control signal received from the control logic 120. Similarly, when the multiplexer is interposed between the write/read circuit 150 and the data I/O circuit 160, the multiplexer may be connected to the write/read circuit 150 through the data lines DL, and connect some of the data lines DL with the data I/O circuit 160 based on an internal control signal received from the control logic 120.

Figure 4:
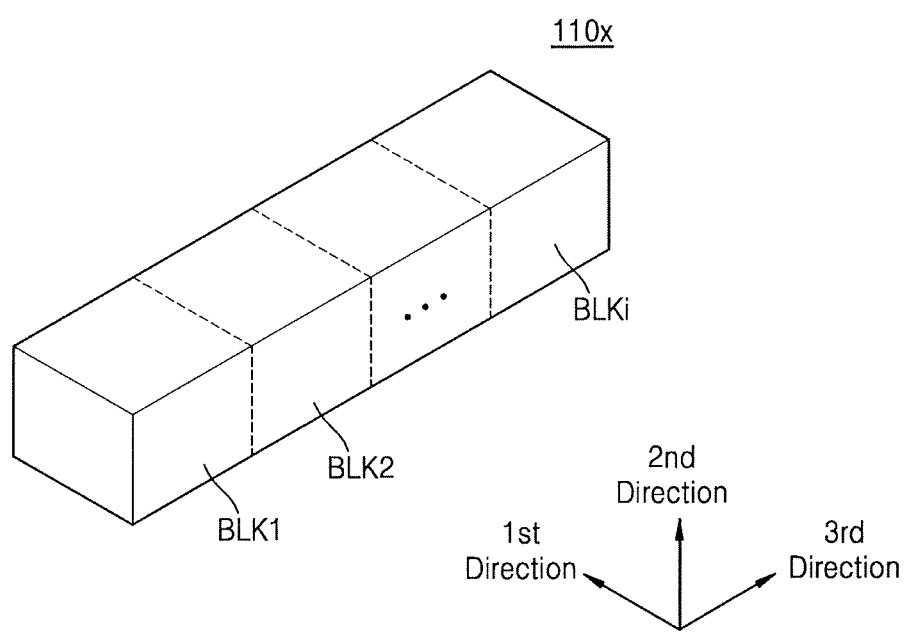
FIG. 4 illustrates a memory cell array included in the memory device of FIG. 3 according to an exemplary embodiment of the present inventive concept.

FIG. 4 illustrates a memory cell array 110x included in the memory device 100 of FIG. 3 in an exemplary embodiment of the present inventive concept. Referring to FIG. 4, the memory cell array 110x may include a plurality of memory blocks BLK1 to BLKi.

Each of the plurality of memory blocks BLK to BLKi may have a 3D structure (or vertical structure). For example, each of the plurality of memory blocks BLK to BLKi may include structures, which may extend along first to third directions. For example, each of the memory blocks BLK to BLKi may include a plurality of strings or NAND strings, which may extend in a second direction. In this case, the plurality of strings may be provided a predetermined distance apart from one another in first and third directions.

The memory blocks BLK1 to BLKi may be selected by the row decoder 140 of FIG. 3. For example, the row decoder 140 may select a memory block corresponding to a block address, from among the memory blocks BLK1 to BLKi. In this case, each of the memory blocks BLK1 to BLKi may be connected to a plurality of bit lines BL, a plurality of string selection lines SSL, a plurality of word lines WL, a plurality of ground selection lines GSL, and common source line CSL. The memory blocks BLK1 to BLKz will be described in further detail with reference to FIGS. 5 and 6.

Figure 5:
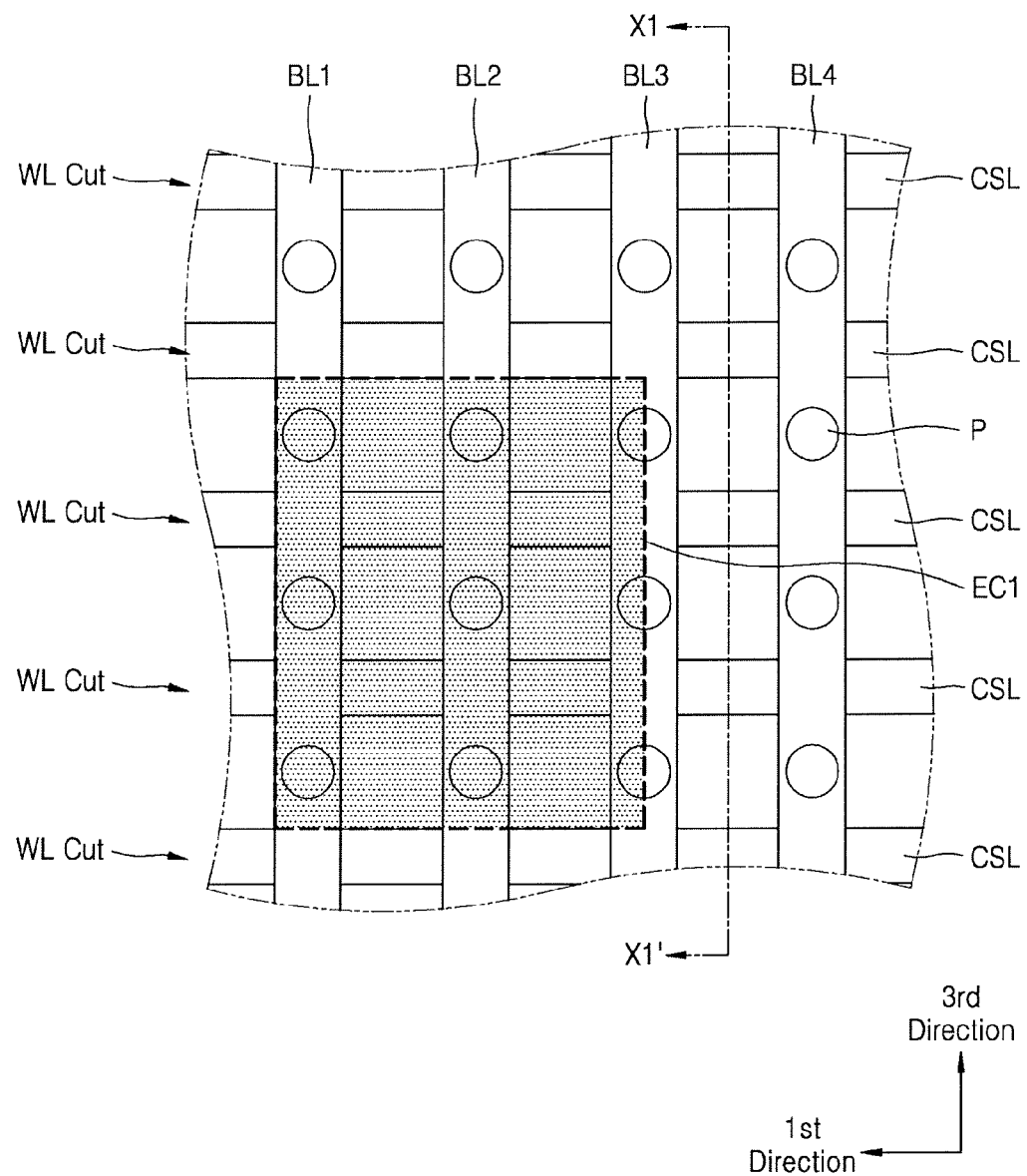
FIG. 5 is a plan view of a portion of a memory block, which is one of memory blocks of FIG. 4, according to an exemplary embodiment of the present inventive concept.
Figure 6:
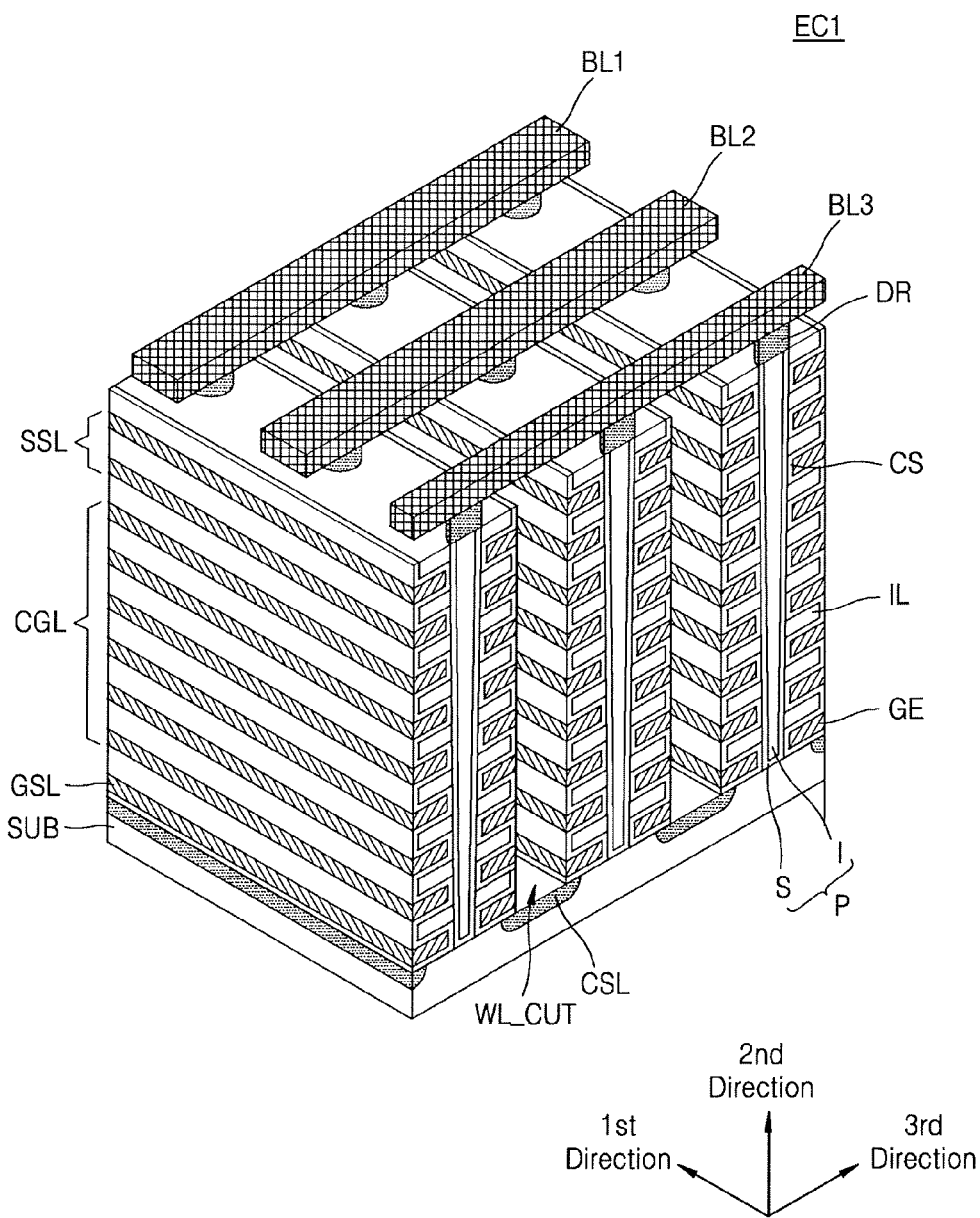
FIG. 6 is a perspective view of a portion of the plan view of FIG. 5 according to an exemplary embodiment of the present inventive concept.

FIG. 5 is a plan view of a portion of a memory block BLKx, which is one of the memory blocks BLK1 to BLKi of FIG. 4, according to an exemplary embodiment. FIG. 6 is a perspective view of a portion EC1 of the plan view of FIG. 5. Referring to FIGS. 5 and 6, 3D structures may extend in first to third directions.

The memory block BLKx may be formed in a direction perpendicular to a substrate SUB, for example, in the second direction perpendicular to the first and third directions. Referring to the plan view of FIG. 5, a plurality of bit lines BL1 to BL4 may extend in the third direction, and a plurality of cell gate lines CGL may extend in the first direction. The bit lines BL1 to BL4 may intersect the cell gate lines CGL. Although FIGS. 5 and 6 illustrate the memory block BLKx in which two string selection lines SSL, six cell gate lines CGL, a ground selection line GSL, and four bit lines BL1 to BL4 are arranged at each of a plurality of levels in the second direction, the string selection lines SSL, the cell gate lines CGL, the ground selection line GSL, and the bit lines BL1 may be provided in larger or smaller numbers.

The substrate SUB may have a first conductivity type (e.g., a p type). Common source lines CSL may be disposed in the substrate SUB. The common source lines CSL may extend in a first direction and be doped with impurities of a second conductivity type (e.g., an n type). A plurality of insulating layers IL may be disposed on a region of the substrate SUB between two adjacent common source lines CSL. The plurality of insulating layers IL may extend in the first direction and be sequentially provided in a second direction. The plurality of insulating layers IL may be spaced a predetermined distance apart from one another in the second direction. For example, the plurality of insulating layers IL may include an insulating material, such as silicon oxide.

A plurality of pillars P may be formed on a region of the substrate SUB between two adjacent common source lines CSL. The plurality of pillars P may be sequentially formed in the first direction and penetrate a plurality of insulating layers IL in the second direction. For example, the plurality of pillars P may penetrate the plurality of insulating layers IL and contact the substrate SUB. For example, a surface layer S of each of the pillars P may include a silicon material of the first conductivity type and function as a channel region. Meanwhile, an inside I of each of the pillars P may include an insulating material (e.g., silicon oxide) or an air gap. It will be understood that the pillars P are illustrated in the plan view of FIG. 5 for brevity.

A charge storage layer CS may be formed between in a region between two adjacent common source lines CSL along exposed surfaces of the insulating layers IL, the pillars P, and the substrate SUB. For example, the charge storage layer CS may have an oxide-nitride-oxide (ONO) structure. Also, a gate electrode GE may be provided in the region between the two adjacent common source lines CSL on an exposed surface of the charge storage layer CS.

A conductive material may be formed on exposed surfaces of the charge storage layer CS between the plurality of insulating layers IL. The conductive material may be separated by word line cuts (WL cuts) and form cell gate lines CGL, which may extend in the first direction. For example, the cell gate lines CGL may include a metallic conductive material or a non-metallic conductive material, such as polysilicon (poly-Si). In an exemplary embodiment, the word line cuts WL cuts may be a groove dividing adjacent word lines along the third direction. The word line cuts WL cuts may be filled with an insulating material.

Drains DR may be respectively disposed on the plurality of pillars P. For example, the drains DR may include a silicon material doped with impurities having the second conductivity type. Bit lines BL may be disposed on the drains DR. The bit lines BL may extend in a third direction and be spaced a predetermined distance apart from one another in the first direction.

Figure 7:
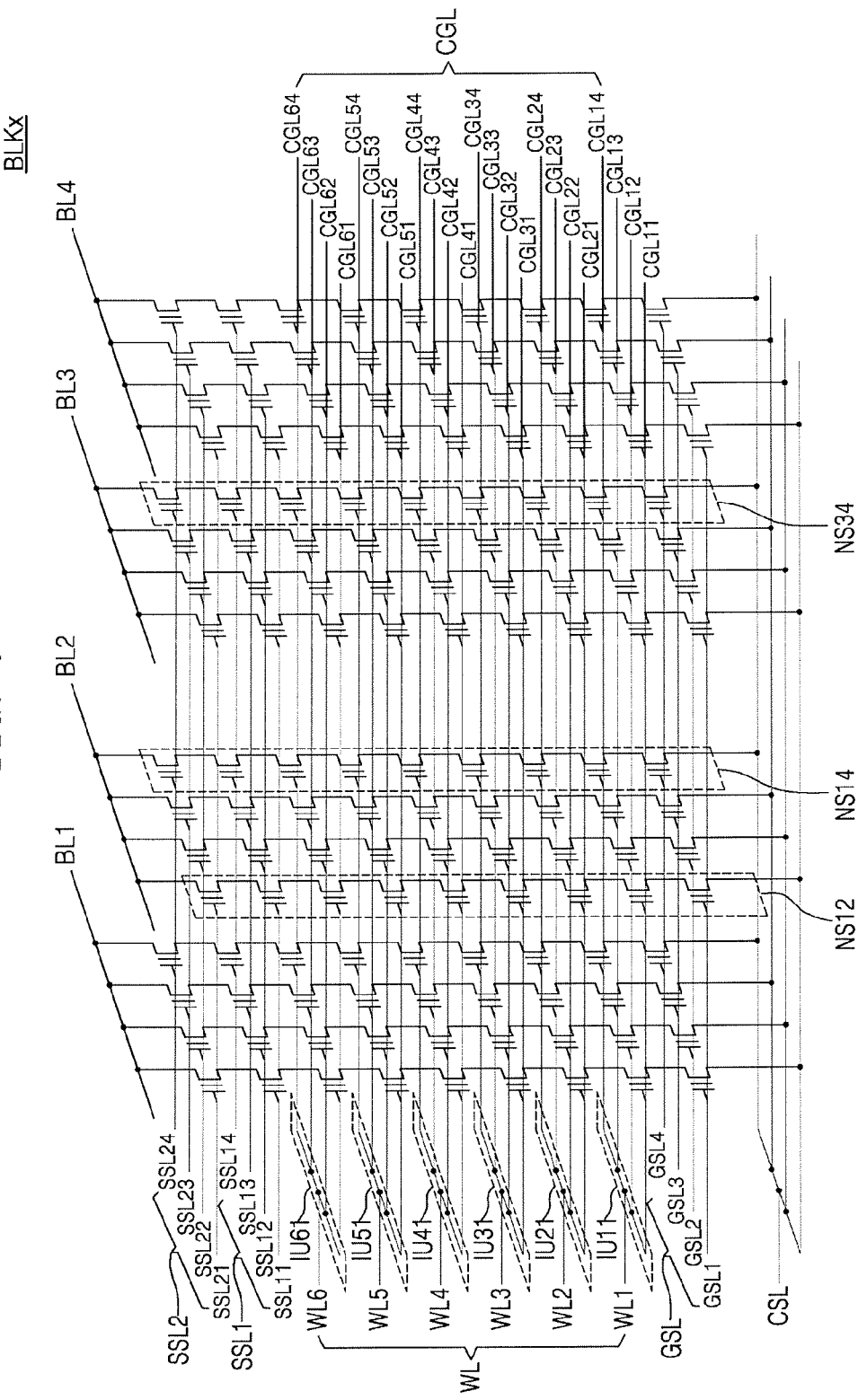
FIG. 7 is an equivalent circuit diagram of a first memory block, which is one of the memory blocks of FIG. 4, according to an exemplary embodiment of the present inventive concept.

FIG. 7 is an equivalent circuit diagram of a memory block BLKx, which is one of the memory blocks BLK1 to BLKi of FIG. 4, according to an exemplary embodiment. Referring to FIG. 7, the memory block BLKx may be a VNAND flash memory, and each of the memory blocks BLK1 to BLKi shown in FIG. 4 may be expressed as shown in FIG. 7. A string shown in FIG. 7 may include two string selection transistors SST1 and SST2, a plurality of cell transistors CT1 to CT6, and a ground selection transistor GST as shown in FIG. 1, but the inventive concept is not limited thereto.

Referring to FIG. 7, the memory block BLKx may include a plurality of strings (e.g., NS12, NS14, and NS34), a plurality of word lines (e.g., WL1 to WL6), a plurality of bit lines (e.g., BL1 to BL4), a plurality of ground selection lines (e.g., GSL1 to GSL4), a plurality of string selection lines (e.g., SSL1 and SSL2), and a common source line CSL. The number of strings, the number of word lines, the number of bit lines, the number of ground selection lines, and the number of string selection lines may be variously changed according to exemplary embodiments.

Four strings may be provided between each of the bit lines BL1 to BL4 and the common source line CSL. Referring to FIGS. 1 and 7, each of the strings (e.g., NS12) may include the ground selection transistor GST, a plurality of cell transistors CT1 to CT6, and two string selection transistors SST1 and SST2, which are connected in series between the common source line CSL and one of the bit lines BL1 to BL4. Hereinafter, the string will also be referred to as a NAND string.

Strings connected in common to one bit line may constitute one column. For example, four strings connected in common to a first bit line BL1 may correspond to a first column, four strings connected in common to a second bit line BL2 may correspond to a second column, four strings connected in common to a third bit line BL3 may correspond to a third column, and four strings connected in common to a fourth bit line BL4 may correspond to a fourth column.

Strings connected to one string selection line may constitute one row. For example, strings connected to string selection lines SSL11 and SSL21 and a first ground selection line GSL1 may correspond to a first row, and strings connected to string selection lines SSL12 and SSL22 and a second ground selection line GSL2 may correspond to a second row. Also, strings connected to string selection lines SSL13 and SSL23 and a third ground selection line GSL3 may correspond to a third row, and strings connected to string selection lines SSL14 and SSL24 and a fourth ground selection line GSL4 may correspond to a fourth row.

The plurality of cell transistors CT1 to CT6 may be connected to the word lines WL1 to WL6, respectively. For example, gates of the cell transistors CT1 to CT6 may be connected to a plurality of cell gate lines CGL corresponding respectively thereto, and the cell gate lines CGL may be respectively connected to a plurality of first interconnection units IU11 to IU61 corresponding thereto.

For example, four cell gate lines CGL11 to CGL14 arranged at the same level and a first interconnection unit IU11 may constitute a first word line WL1. The first interconnection unit IU11 may be connected to the four cell gate lines CGL11 to CGL14. A signal (e.g., a read voltage) provided by the row decoder 140 to the first word line WL1 may be transmitted to four cell gate lines CGL11 to CGL14 through the first interconnection unit IU11, and cell transistors disposed at the same level may receive the signal through the cell gate lines CGL11 to CGL14 corresponding thereto.

As described with reference to FIG. 6, the cell gate lines CGL may include a conductive material. A signal applied to the word lines WL1 to WL6 may be delayed depending on a length of the cell gate lines CGL, a resistance of the conductive material, a filled state of the conductive material, and a capacitance formed by the cell gate lines CGL. For example, a read voltage applied to the first word line WL1 may be transmitted to a cell transistor included in a string connected to the fourth bit line BL4 later than a read voltage applied to a cell transistor included in a string connected to the first bit line BL1. The transmission of the read voltage may be further delayed according to characteristics of the cell gate lines CGL11 to CGL14.

To reduce a delay in the transmission of the read voltage, the row decoder 140 may apply a signal to both ends of the cell gate lines CGL according to an exemplary embodiment. For example, two signal sources may be disposed at both ends of the cell gate lines to drive both ends of each of the cell gate lines. Accordingly, signals from the signal sources may transmit faster through the cell gate line compared to driving a single end of the cell gate. Thus, a time constant may be reduced to about one-fourth than when a single signal source drives a cell gate line. Although FIG. 7 illustrates only six word lines WL1 to WL6, when a large number of word lines and a large number of memory blocks are provided, a size of the row decoder 140 configured to apply signals to the both ends of the cell gate lines CGL may increase, and a high complexity of interconnections may be required to electrically connect both ends of the word lines with the row decoder 140.

String selection transistors SST included in strings NS may be respectively connected to string selection lines SSL11 to SSL14 and SSL21 to SSL24, and ground selection transistors GST may be respectively connected to ground selection lines GSL1 to GSL4. Also, respective drains of the string selection transistors SST may be connected to bit lines BL corresponding thereto, and respective sources of the ground selection transistors GST may be connected to the common source line CSL.

Gates of cell transistors disposed at the same level may be configured to have the same electric potential. For example, cell gate lines (e.g., CGL11 to CGL14) respectively connected to the cell transistors disposed at the same level may be electrically connected to one another through an interconnection unit (e.g., IU11). Thus, a voltage may be uniformly applied by the row decoder 140 to the gates of the cell transistors disposed at the same level. The cell gate lines may be separated from each other by a word line cut WL_cut.

String selection transistors included in different strings may be configured to be controlled independent of one another. For example, four string selection lines (e.g., SSL11 to SSL14) connected to gates of string selection transistors disposed at the same level may be insulated from one another and independently receive signals from the row decoder 140. Here, a plurality of strings connected in common to one of a plurality of string selection lines (e.g., SSL11 to SSL14) arranged at the same level or cell transistors included in the strings may be referred to as being in the same plane. For example, in FIG. 7, a string NS14 and a string NS34 connected in common to the string selection line SSL24 may be referred to as being included in the same plane.

A cell transistor to be read may be selected by selecting a pair of string selection lines, which are connected to the same string, out of the plurality of string selection lines SSL11 to SSL14 and SSL21 to SSL24 and selecting one word line out of the plurality of word lines WL1 to WL6. For example, when a selection voltage V_ON may be applied to a pair of string selection lines SSL11 and SSL21 and a read voltage is applied to the third word line WL3, cell transistors included in strings of a first row and connected to the third word line WL3 may be read.

Although FIG. 7 illustrates an example in which a string includes two string selection transistors, the inventive concept is not limited thereto. For example, when the string includes one string selection transistor, a cell transistor to be read may be determined by selecting one of the plurality of string selection lines and selecting one of the plurality of word lines. In an exemplary embodiment, six cell transistors connected to the word lines WL1 to WL6 and included in one string may include at least one dummy cell and a plurality of memory cells. For example, cell transistors connected to the first word line WL1 and cell transistors connected to the sixth word line WL6 may be dummy cells configured to protect memory cells connected to the second to fifth word lines WL2 to WL5.

Figure 8B:
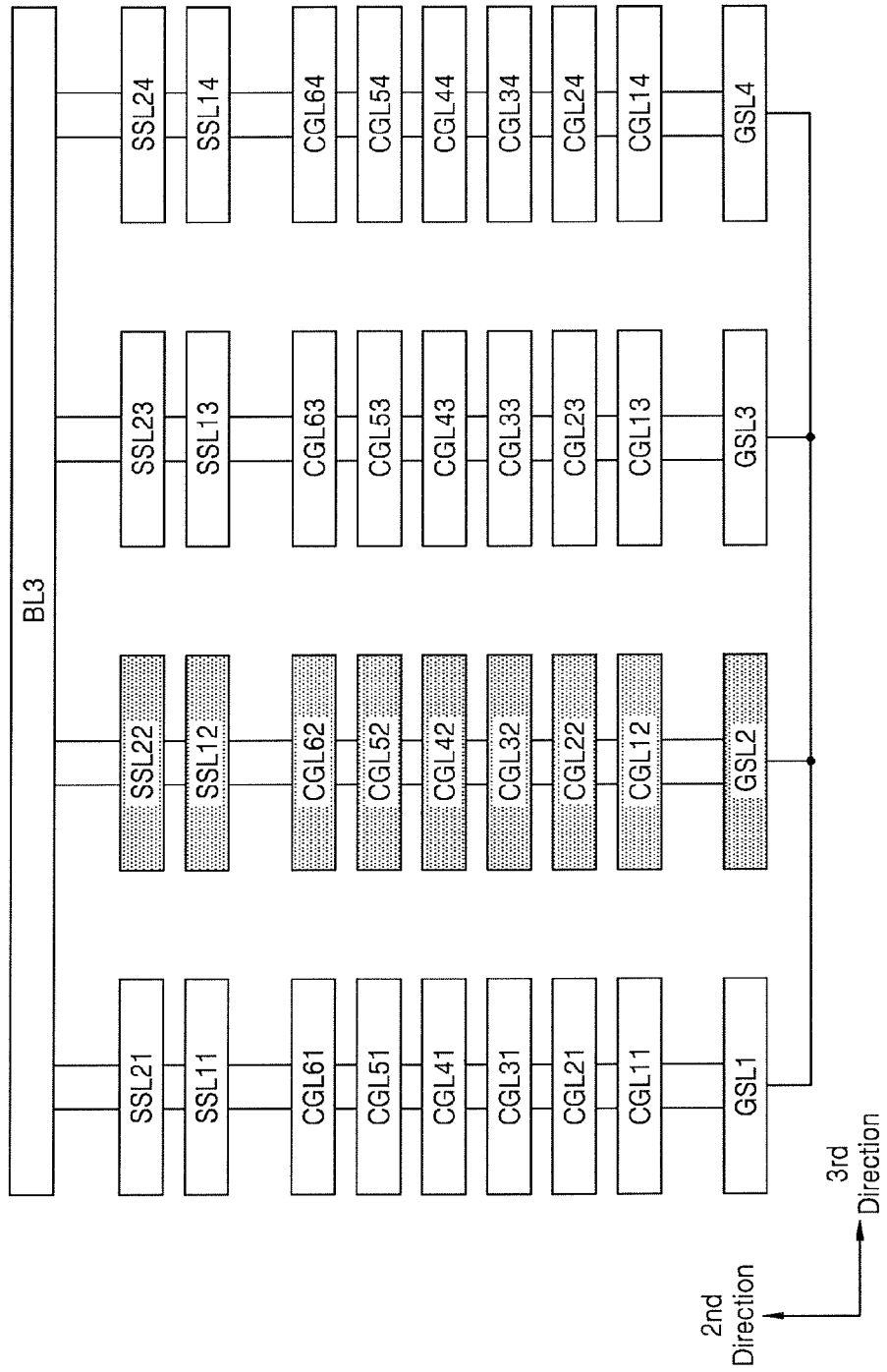

FIGS. 8A and 8B are schematic cross-sectional views taken along a line X1-X1' of FIG. 5, which illustrate a capacitance formed by cell gate lines. For example, FIG. 8A illustrates a capacitance formed by cell gate lines during a read operation of the memory block BLKx of FIG. 7 in which ground selection lines GSL1 to GSL4 are electrically connected to one another to have the same electric potential. FIG. 8B illustrates a capacitance formed by cell gate lines during a read operation of the memory block BLKx of FIG. 7 in which ground selection lines GSL1 to GSL4 are insulated from one another and independently controlled. In FIGS. 8A and 8B, a selection voltage V_ON may be applied to a pair of string selection lines SSL12 and SSL22, while a non-selection voltage V_OFF may be applied to other string selection lines SSL11, SSL13, SSL14, SSL21, SSL23, and SSL24. Also, in FIGS. 8A and 8B, hatched regions denote cell gate lines that form a capacitance during the read operation.

Referring to FIG. 8A, when four ground selection lines GSL1 to GSL4 are electrically connected, a constant voltage (e.g., a ground voltage) may be applied from a common source line CSL to channels of strings NS of the memory block BLKx. Thus, cell gate lines CGL constituting word lines WL1 to WL6 may form a relatively high capacitance, and a time taken to transmit a read voltage or a pass voltage to cell transistors CT through the cell gate lines CGL may increase. Also, the relatively high capacitance formed by the cell gate lines CGL may cause high power consumption during the transmission of the read voltage or the pass voltage. Referring to FIG. 6, in a VNAND flash memory, since a cell transistor CT is a gate-all-around-type transistor having a gate surrounding a channel thereof, the channel of the cell transistor CT may have a larger area than a channel of a cell transistor of a planar NAND flash memory so that a capacitance formed by the cell gate lines CGL may be higher than a capacitance formed by cell gate lines in the planar NAND flash memory.

Referring to FIG. 8B, when the four ground selection lines GSL1 to GSL4 are insulated from one another and independently controlled, a selection voltage V_ON may be applied only to the ground selection line GSL2 connected to a selected string. For example, when a cell transistor included in strings connected to a pair of string selection lines SSL12 and SSL22 is read, a selection voltage V_ON may be applied to the second ground selection line GSL2, and a non-selection voltage V_OFF may be applied to other ground selection lines GSL1, GSL3, and GSL4. Thus, a ground voltage may be applied from the common source line CSL to channels of strings connected to the second ground selection line GSL2, and channels of cell transistors included in strings connected to other ground selection lines GSL1, GSL3, and GSL4 may be floated. Since six cell gate lines CGL12 to CGL62 connected to cell transistors included in the strings connected to the second ground selection line GSL2, from among the cell gate lines CGL constituting the word lines WL1 to WL6, form a capacitance, the capacitance formed by the cell gate lines CGL may be reduced to about one-fourth as compared with the example of FIG. 8A.

As shown in FIG. 8B, when a plurality of ground selection lines GSL are insulated from one another and independently controlled, a capacitance formed by the cell gate lines CGL may be reduced during a read operation, and the cell transistor may be protected from undesired phenomena. For example, in FIG. 8B, since a read voltage or a pass voltage is applied to a gate of the cell transistor included in a string connected to the third ground selection line GSL3 while a channel of the cell transistor is floated, charges stored in a charge storage layer CS may be prevented from leaking into the channel of the cell transistor or flowing into the charge storage layer CS so that loss of stored data may be prevented.

Although FIG. 8B illustrates a case in which four ground selection lines GSL1 to GSL4 are independently controlled, the present inventive concept is not limited thereto. For example, the number of ground selection lines that are independently controlled may be equal to or smaller than the number of pairs of string selection transistors that are independently controlled. For example, in FIG. 8B, the first and second ground selection lines GSL1 and GSL2 may be electrically connected to each other and have the same electric potential, while third and fourth ground selection lines GSL3 and GSL4 may be electrically connected to each other and have the same electric potential. Hereinafter, a case in which the number of ground selection lines of a memory block is equal to the number of pairs of string selection transistors that are independently controlled will be described for brevity.

Figure 9A:
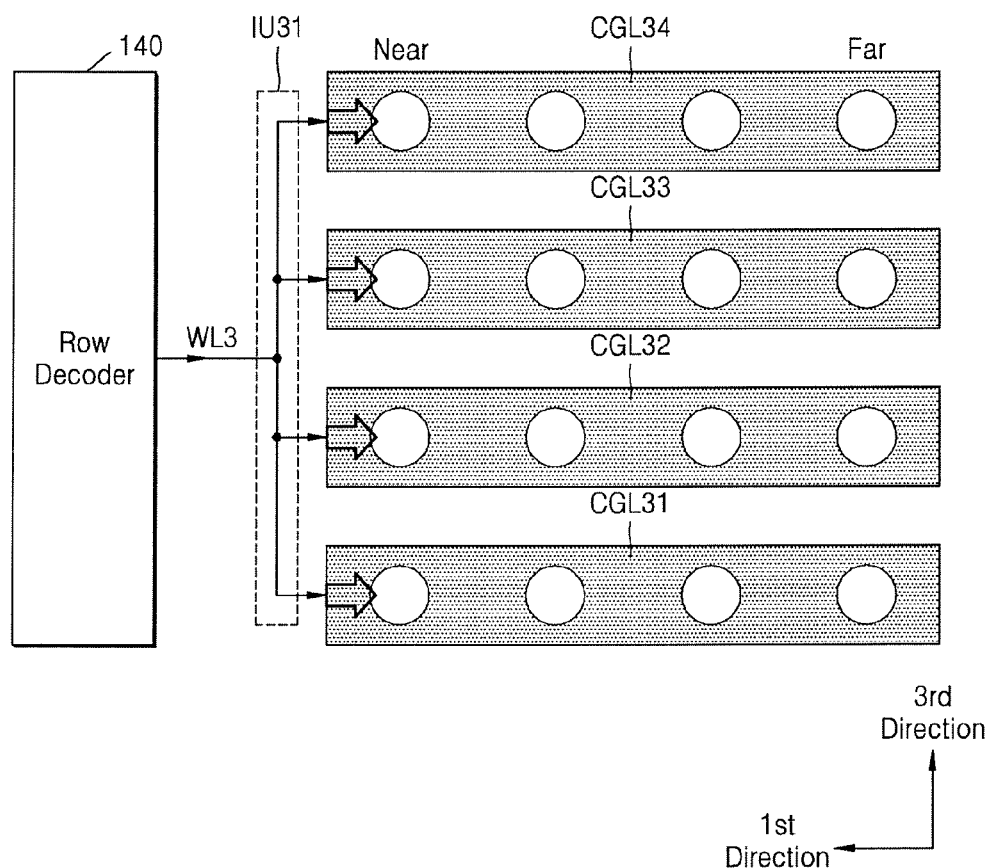
FIGS. 9A and 9B show phenomena caused to the first memory block of FIGS. 8A and 8B, respectively, according to an exemplary embodiment of the present inventive concept.
Figure 9B:
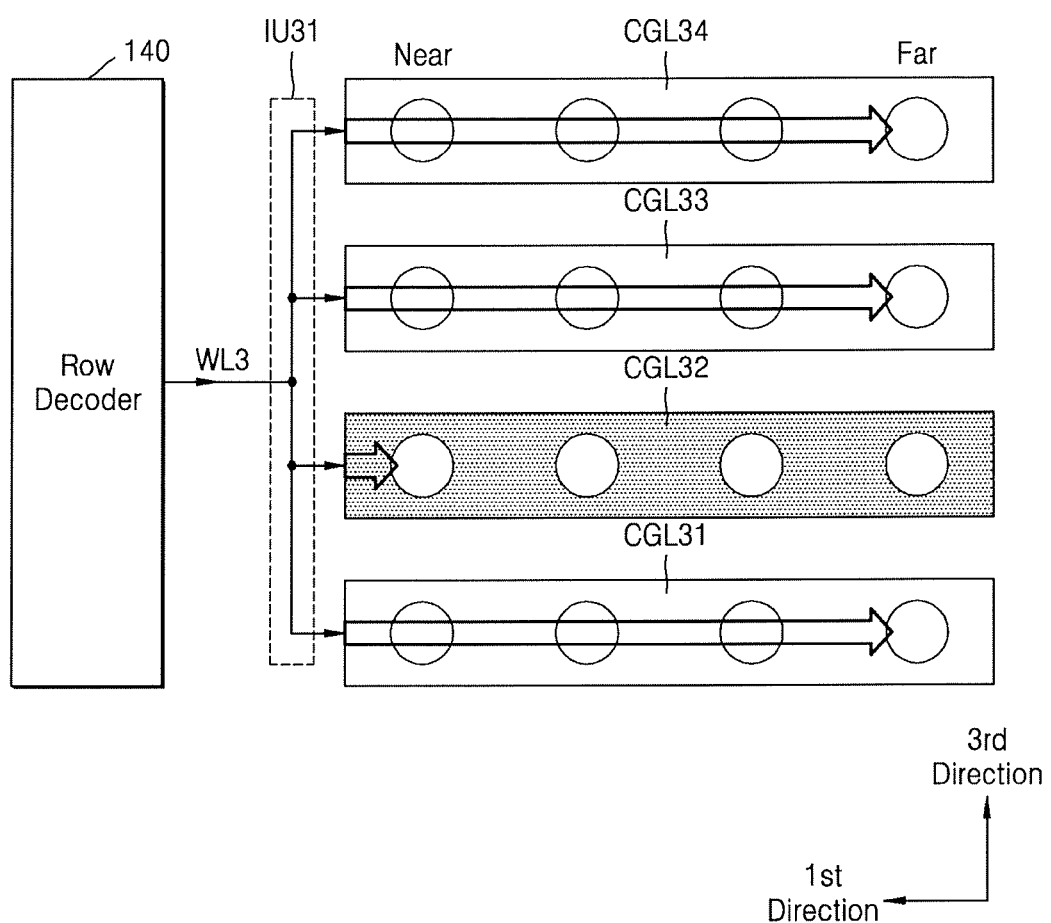

FIGS. 9A and 9B show phenomena caused to the examples of the memory block BLKx shown in FIGS. 8A and 8B, respectively. For example, FIG. 9A corresponds to an example in which a plurality of ground selection lines GSL1 to GSL4 are electrically connected, and FIG. 9B corresponds to an example in which a plurality of ground selection lines GSL1 to GSL4 are insulated from one another and independently controlled. Also, FIGS. 9A and 9B show states of cell gate lines CGL31 to CGL34 constituting a third word line WL3 when a cell transistor connected to the cell gate line CGL32 constituting the third word line WL3 is read.

In FIG. 8B, capacitances formed by the cell gate lines CGL may be reduced. Thus, cell gate lines (CGL11 to CGL61, CGL13 to CGL63, and CGL14 to CGL64 in FIG. 8B) connected to cell transistors of strings connected to ground selection lines (GSL1, GSL3, and GSL4 in FIG. 8B) to which the non-selection voltage V_OFF is applied may increase a transmission speed of signals due to the reduced capacitances. In contrast, cell gate lines (CGL12 to CGL62 in FIG. 8B) connected to cell transistors of strings corresponding to a ground selection line (GSL2 in FIG. 8B) to which the selection voltage V_ON is applied may increase the transmission speed of signals. Hereinafter, detailed descriptions related thereto will be presented with reference to FIGS. 9A and 9B.

Referring to FIG. 9A, a read voltage may be applied by the row decoder 140 to the third word line WL3. The read voltage may be transmitted through a first interconnection unit IU31 to each of the four cell gate lines CGL31 to CGL34. As described above with reference to FIG. 8A, since a selection voltage is applied in common to gates of the four ground selection lines GSL1 to GSL4, a ground voltage may be applied to channels of all strings. Thus, the cell gate lines CGL31 to CGL34 may form a relatively high capacitance. Accordingly, as indicated by arrows in FIG. 9A, the read voltage may be transmitted relatively slowly through four cell gate lines CGL31 to CGL34, and a difference between a time taken to transmit a read voltage to a cell transistor located near the row decoder 140 and a time taken to transmit a read voltage to a cell transistor located far from the row decoder 140 may be relatively large.

Referring to FIG. 9B, a read voltage applied by the row decoder 140 to the third word line WL3 may be transmitted through the first interconnection unit IU31 to each of the four cell gate lines CGL31 to CGL34. As described above with reference to FIG. 8B, a selection voltage V_ON may be applied to the gate of the second ground selection line GSL2 corresponding to a selected string, and a non-selection voltage V_OFF may be applied to the gates of the other ground selection lines GSL1, GSL3, and GSL4 so that cell transistors connected to the three cell gate lines CGL31, CGL33, and CGL34 may have floated channels. Thus, as indicated by long arrows in FIG. 9B, the read voltage may be transmitted at relatively high speed through the three cell gate lines CGL31, CGL33, and CGL34.

The cell gate line CGL32 corresponding to the selected string may form a capacitance due to the second ground selection transistor GST2 having a gate to which the selection voltage V_ON is still applied. Accordingly, as indicated by short arrows in FIG. 9B, a time taken for the read voltage to be transmitted through the cell gate line CGL32 may not be markedly reduced.

Figure 10:
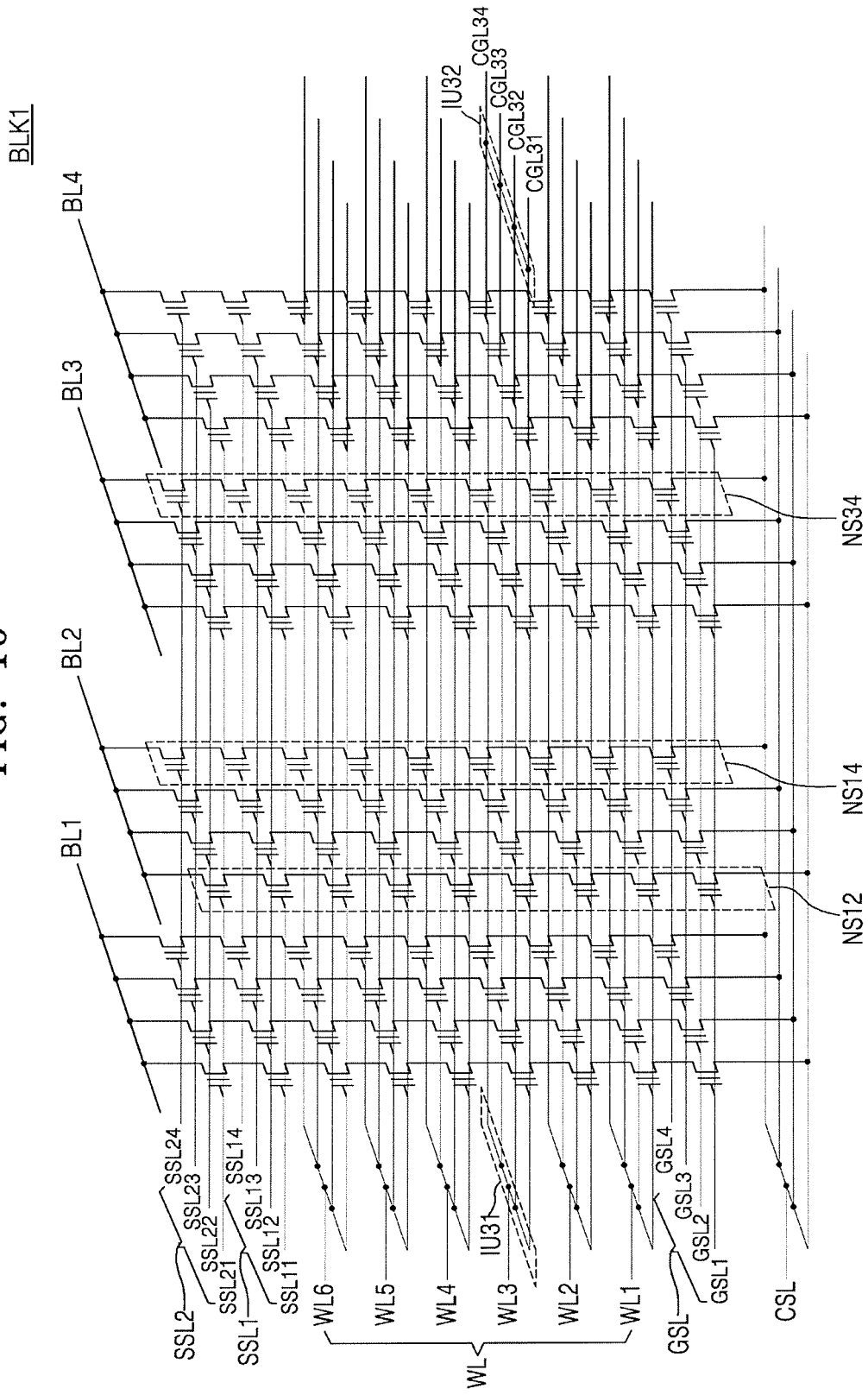
FIG. 10 is an equivalent circuit diagram of a first memory block, which is one of memory blocks of FIG. 4, according to an exemplary embodiment of the present inventive concept.
Figure 11:
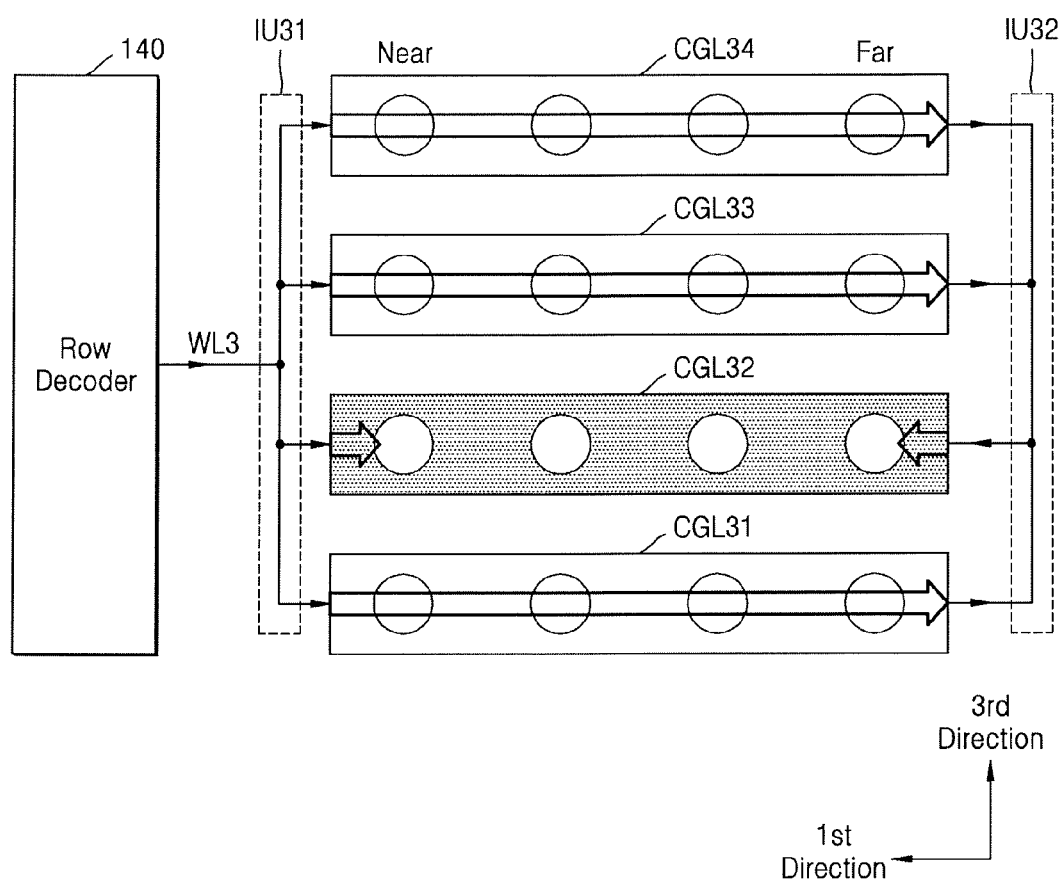
FIG. 11 shows a phenomenon caused to a third word line of the first memory block corresponding to an equivalent circuit of FIG. 10 according to an exemplary embodiment of the present inventive concept.

FIG. 10 is an equivalent circuit diagram of the first memory block BLK1, which is one of the memory blocks BLK1 to BLKi of FIG. 4, according to an exemplary embodiment, and FIG. 11 shows a phenomenon caused to the third word line WL3 of the first memory block BLK1 corresponding to an equivalent circuit of FIG. 10. In the circuit diagram of FIG. 10, though nodes connected to one wire may have the same electric potential, in the circuit diagram of FIG. 10, it will be understood that respective wires constituting the same node (or net) are illustrated based on physical positions of the wires. Hereinafter, the first memory block BLK1 may be any of the memory blocks BLK1 to BLKi of FIG. 4.

The first memory block BLK1 (or a memory cell array 110) according to an exemplary embodiment may include a cell transistor configured to receive a signal provided by a row decoder 140 through at least two paths. Referring to FIG. 10, the first memory block BLK1 may include cell transistors receiving signals from the row decoder 140 through a first interconnection unit IU31 and a second interconnection unit IU32. For example, cell transistors corresponding to a third word line WL3 may receive signals from the row decoder 140 through the first interconnection unit IU31 and the second interconnection unit IU32. The first interconnection unit IU31 and the second interconnection unit IU32 may electrically connect a plurality of cell string lines CGL31 to CGL34 through two different paths. The second interconnection unit IU32 may be disposed apart from the first interconnection unit IU31.

As indicated by long arrows on the three cell gate lines CGL31, CGL33, and CGL34 in FIG. 11, a read voltage applied to the third word line WL3 may be transmitted relatively rapidly through three cell gate lines CGL31, CGL33, and CGL34 corresponding to unselected strings. The read voltage rapidly transmitted through the three cell gate lines CGL31, CGL33, and CGL34 may be transmitted to the cell gate line CGL32 corresponding to a selected string through the second interconnection unit IU32. Accordingly, a cell transistor located in a region far from the row decoder 140 may receive a read voltage more rapidly through the second interconnection unit IU32 than the cell gate line CGL32. For example, the read voltage may be applied to both ends of the cell gate line CGL32. As a result, a time taken to transmit a read voltage to the cell transistor located in the region far from the row decoder 140 may be reduced so that an operating speed of the memory device 100 may be increased. In addition, since the cell transistor is electrically connected to the row decoder 140 through at least two paths, even if failures occur, even if a portion of a word line (e.g., WL3) is open or a resistance of the word line becomes high, the cell transistor may receive signals from the row decoder 140 through a different path from the path in which failures occur. Thus, a failure rate of the memory device 100 may be reduced.

FIGS. 12A to 12D are diagrams of examples BLK1a to BLK1d of the first memory block BLK1. As described above with reference to FIG. 11, the memory device 100 may electrically connect a plurality of cell gate lines and include a second interconnection unit disposed apart from a first interconnection unit. A cell transistor having a gate electrically connected to the first and second interconnection units may be electrically connected to the row decoder 140 through at least two paths.

Figure 12A:
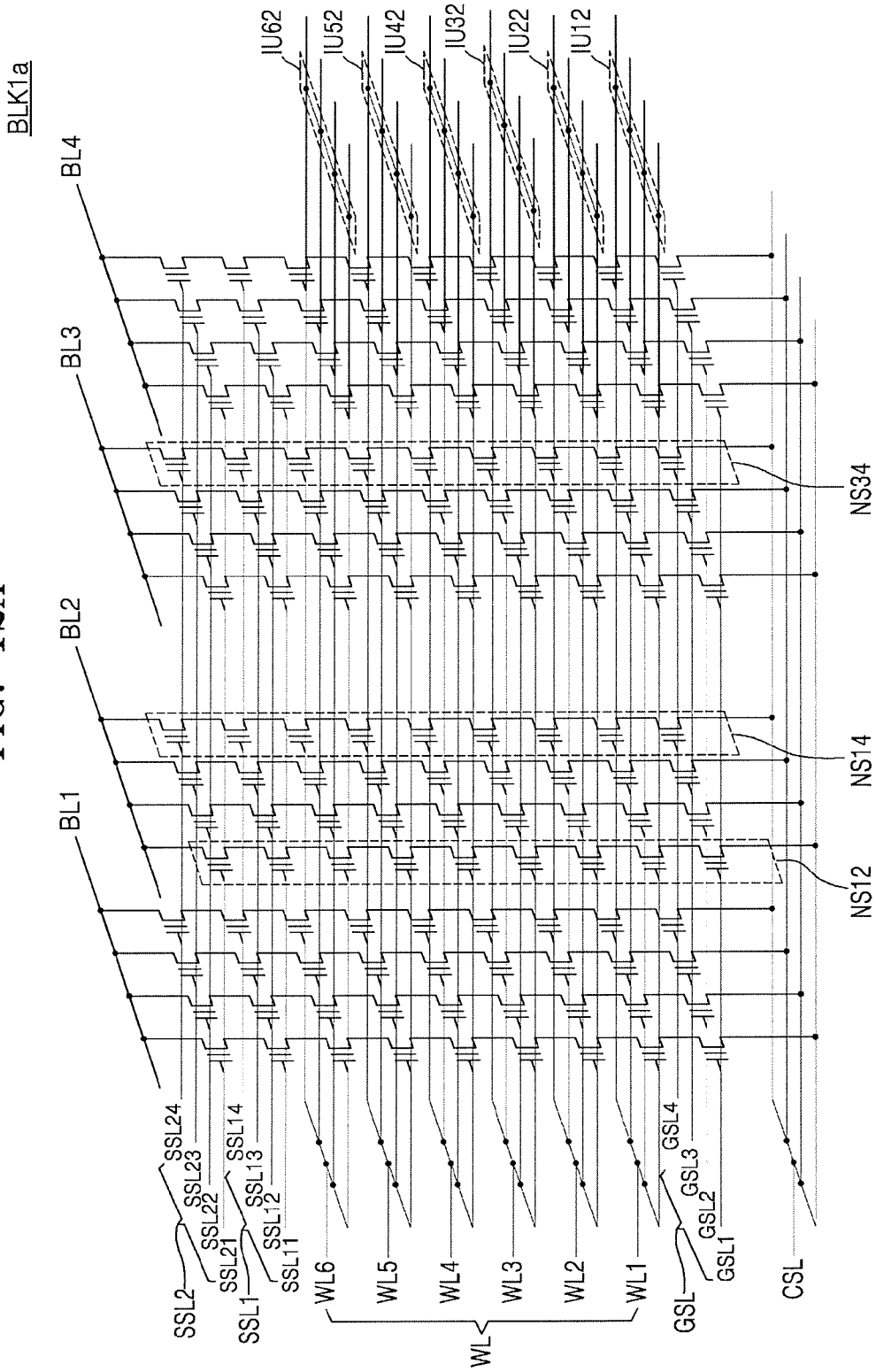
FIGS. 12A to 12D are diagrams of the first memory block of FIG. 4, according to exemplary embodiments of the present inventive concept.

Referring to FIG. 12A, six word lines WL1 to WL6 arranged in the first memory block BLK1a may include six second interconnection units IU12 to IU62, respectively. For example, each of cell gate lines CGL arranged in the first memory block BLK1a may be connected to at least one of the second interconnection units IU12 to IU62. Cell transistors disposed near the second interconnection units IU2 to IU62 may receive not only a read voltage but also a pass voltage relatively rapidly through the second interconnection units IU12 to IU62.

As shown in FIG. 12A, the second interconnection units IU12 to IU62 may be connected to one ends of the cell gate lines (i.e., ends opposite to one ends of the cell gate lines connected to the first interconnection units). In an exemplary embodiment, the second interconnection units IU12 to IU62 may electrically connect middle regions of the cell gate lines (e.g., regions connected to third interconnection units IU13 to IU63 to be described later with reference to FIG. 12D).

Figure 12B:
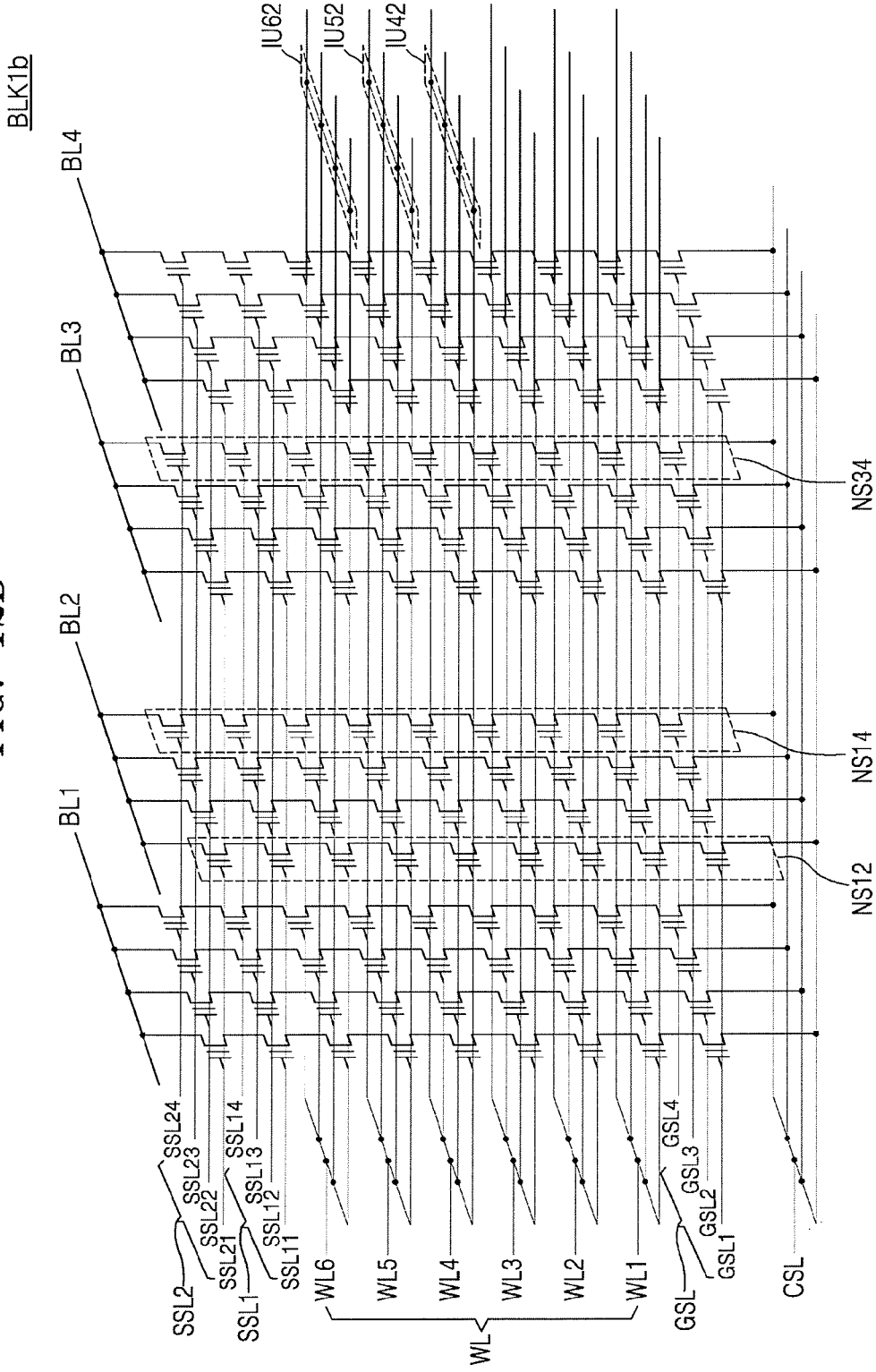

Referring to FIG. 12B, according to an exemplary embodiment, word lines WL4 to WL6 arranged near bit lines BL1 to BL4, from among six word lines WL1 to WL6 arranged in the first memory block BLK1b, may include second connection units IU42 to IU62. Referring to FIG. 6, as a distance from a substrate SUB increases, a diameter of the pillars P may increase, and cell gate lines may form a relatively high channel capacitance. Also, cell gate lines located far from the substrate SUB may have smaller sectional areas and higher resistances than cell gate lines located near the substrate SUB. As a result, since a signal is transmitted relatively slowly through the cell gate lines located far from the substrate SUB, word lines (e.g., WL4 to WL6), which are far from the substrate SUB and near the bit lines BL1 to BL4 from among the word lines WL1 to WL6, may include second interconnection units IU42 to IU62.

Figure 12C:
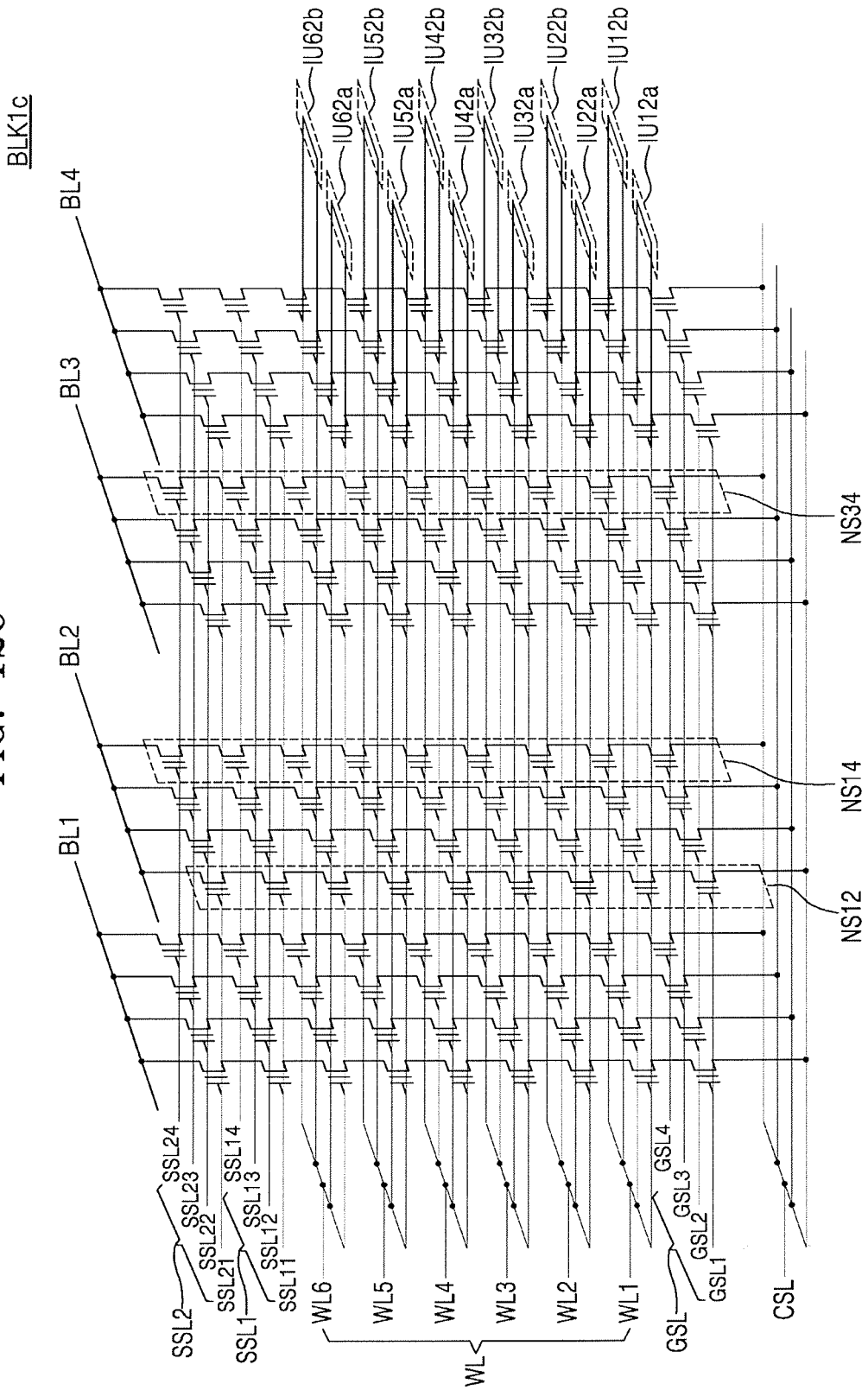

Referring to FIG. 12C, some of a plurality of cell gate lines arranged at the same level may be connected to one another by second interconnection units IU12a to IU62a and IU12b to IU62b. For example, the third word line WL3 may include two second interconnection units IU32a and IU32b, and the two second interconnection units IU32a and IU32b may electrically connect two pairs of cell gate lines, respectively. Since one of a plurality of strings connected to the same bit line is selected and the other strings are unselected during a read operation, two adjacent cell gate lines may be electrically connected to each other. Thus, a read voltage or a pass voltage may be transmitted to a cell transistor through cell gate lines connected to the unselected strings. Therefore, a time taken to transmit the read voltage or the pass voltage may be reduced.

Figure 12D:
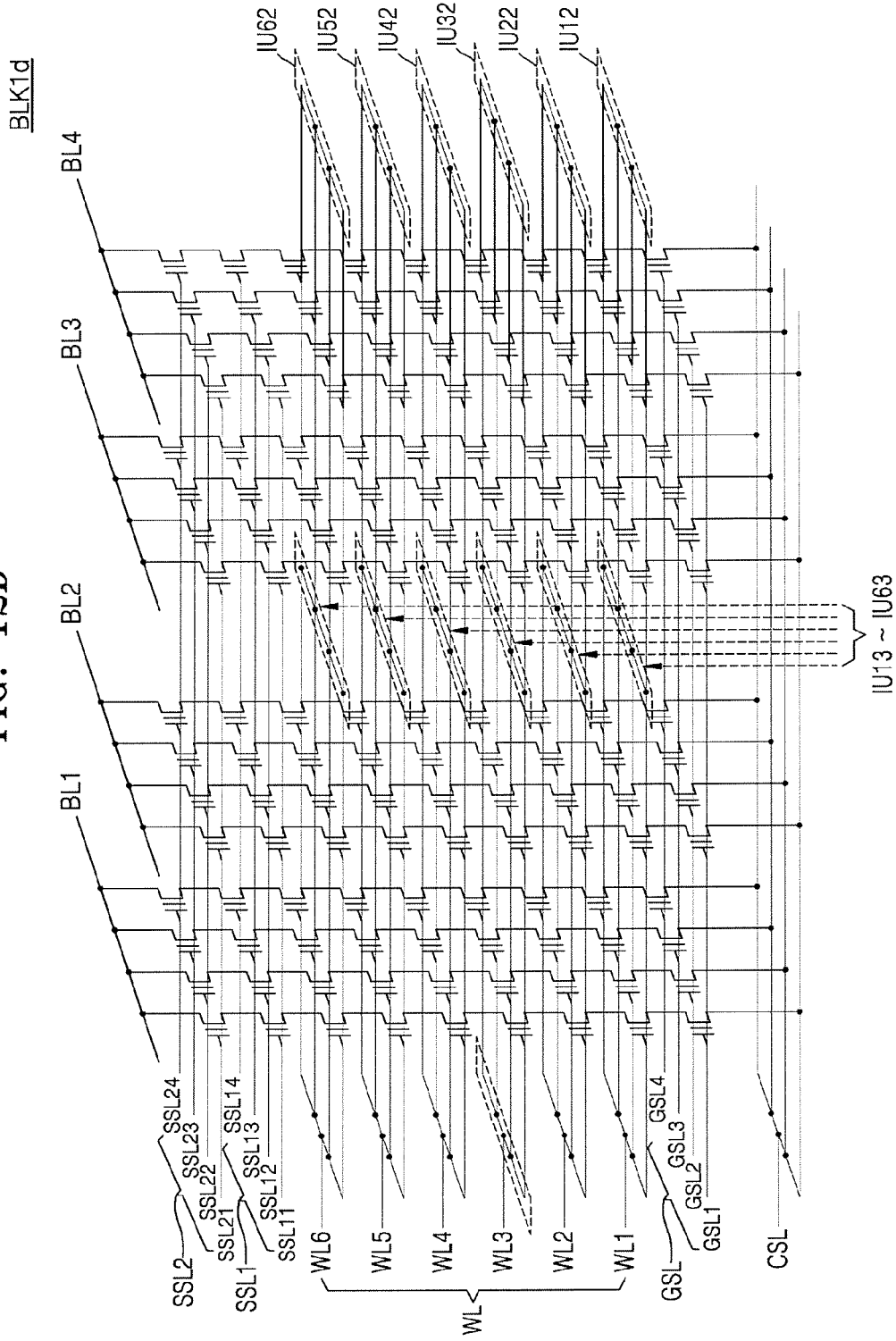

Referring to FIG. 12D, word lines WL1 to WL6 may include the third interconnection units IU13 to IU63. The third interconnection units IU13 to IU63 may further form an additional path between the row decoder 140 and a cell transistor and be spaced apart from the first interconnection units IU11 to IU61 and the second interconnection units IU12 to IU62. For example, the third interconnection units IU13 to IU63 may be disposed between strings connected to the second bit line BL2 and strings connected to the third bit line BL3.

Figure 13:
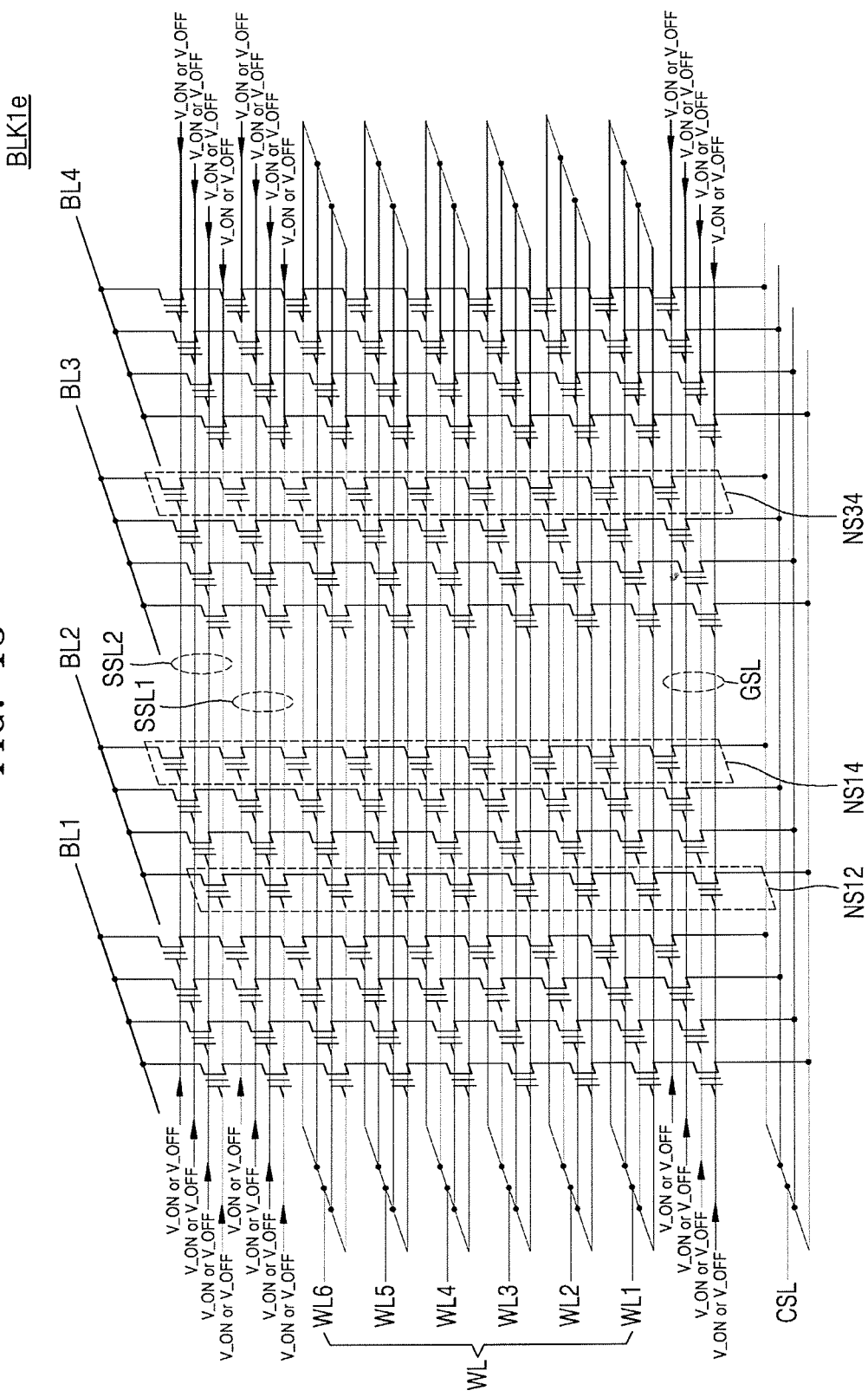
FIG. 13 is an equivalent circuit diagram of a first memory block, which is one of memory blocks of FIG. 4, according to an exemplary embodiment of the present inventive concept.

FIG. 13 is an equivalent circuit diagram of a first memory block BLK1 according to an exemplary embodiment. In FIG. 13, arrows illustrated on wires indicate transmission of signals, for example, the transmission of a selection voltage V_ON or a non-selection voltage V_OFF through ground selection lines GSL and string selection lines SSL.

Similar to the example (i.e., the first memory block BLK1a) described with reference to FIG. 12A, a first memory block BLK1e may include a cell transistor configured to firstly receive a signal provided by the row decoder 140 through second interconnection units. Thus, after the cell transistor receives a signal (e.g., a pass voltage) through one of the second interconnection units, a selection voltage V_ON may be transmitted to string selection transistors SST1 and SST2 and/or a ground selection transistor GST of a string including the cell transistor. When the read voltage is firstly transmitted to the cell transistor, the cell transistor may experience channel boosting. Thereafter, a constant voltage (e.g., a ground voltage applied from a common source line CSL) may be applied to the channel that is boosted in response to the selection voltage V_ON applied to the string selection transistors SST1 and SST2 and/or the ground selection transistor GST. During this process, charges stored in a charge storage layer CS of the cell transistor may be emitted or injected, and data stored in the cell transistor may be lost.

According to an exemplary embodiment, the string selection transistors SST1 and SST2 and/or the ground selection transistors GST may be controlled in response to a signal applied to both ends of a line connected to each of gates thereof. For example, as indicated by arrows in FIG. 13, ground selection transistors GST of respective strings may receive a signal (i.e., a selection voltage V_ON or a non-selection voltage V_OFF) from both ends of the ground selection lines GSL.

Due to the selection voltage V_ON or the non-selection voltage V_OFF substantially simultaneously applied to both ends of the ground selection lines GSL, a difference between times taken for signals to reach the ground selection transistors GST and the cell transistors CT may be reduced. Although FIG. 13 illustrates a case in which the ground selection transistors GST and the cell transistors CT receive signals from both ends of the string selection lines SSL1 and SSL2 and the ground selection lines GSL, the inventive concept is not limited thereto.

Figure 14B:
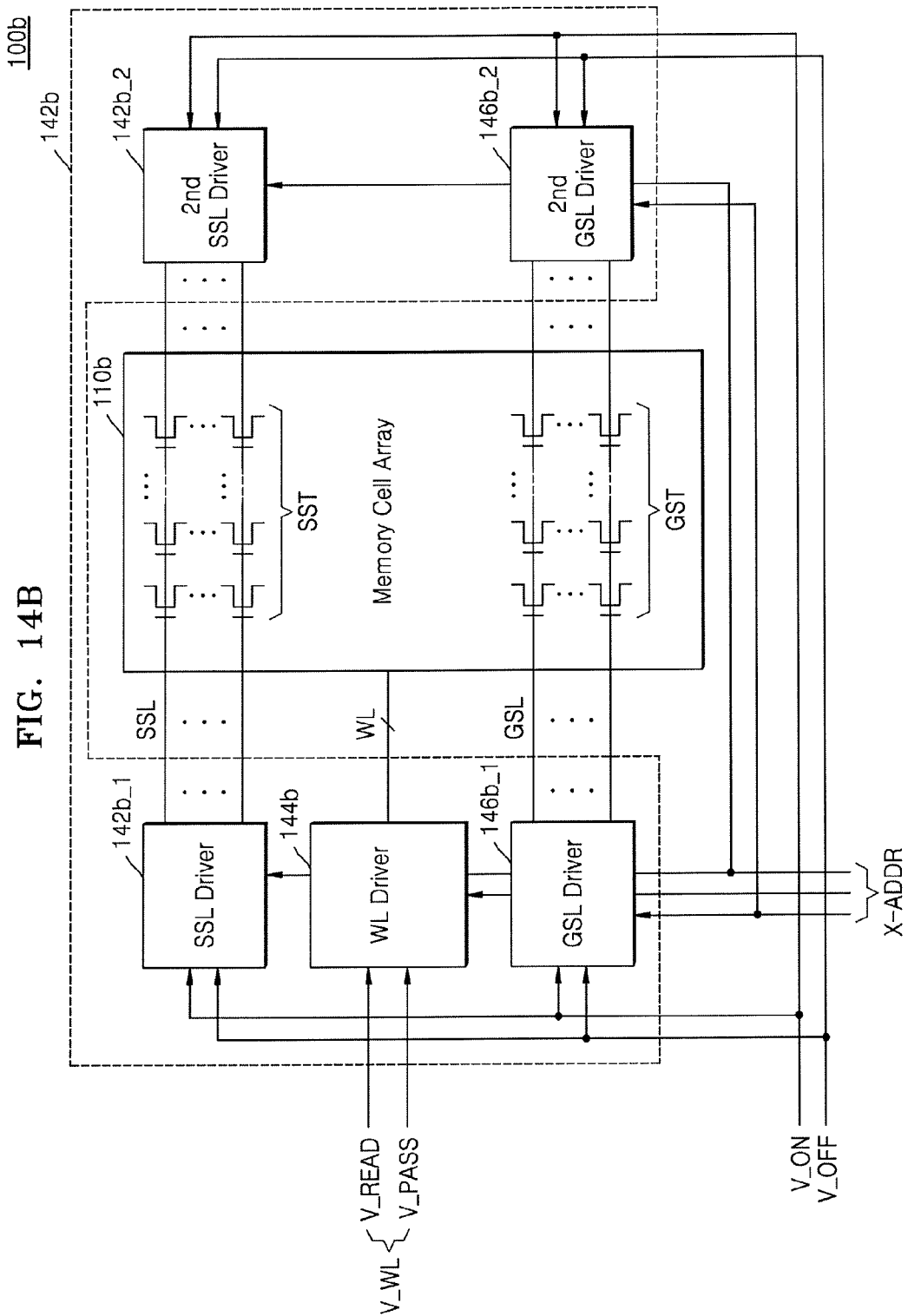

FIGS. 14A and 14B illustrate a memory device 100 including a first memory block BLK1e of FIG. 13 in an exemplary embodiment of the present inventive concept. For example, FIGS. 14A and 14B are block diagrams of a memory cell array 110 including the first memory block BLK1e and a row decoder 140 configured to apply signals to both ends of a string selection lines SSL and a ground selection lines GSL according to an exemplary embodiment of the present inventive concept.

Referring to FIGS. 3 and 14A, a row decoder 140a may receive a word line driving voltage V_WL, a selection voltage V_ON, and a non-selection voltage V_OFF from a voltage generator 130, and receive a row address X_ADDR from a control logic 120. The row decoder 140a may transmit a signal (e.g., a voltage received from the voltage generator 130) through string selection lines SSL, word lines WL, and ground selection lines GSL to a memory cell array 110a. Although FIG. 14A illustrates a read voltage V_READ and a pass voltage V_PASS as a word line driving voltage V_WL, the word line driving voltage V_WL may further include a program voltage and an inhibition voltage. The selection voltage V_ON and the non-selection voltage V_OFF may be applied to the string selection lines SSL and the ground selection lines GSL. In an exemplary embodiment, the selection voltage V_ON and the non-selection voltage V_OFF for the string selection lines SSL may be different from those of the ground selection lines GSL.

The row decoder 140a may include a string selection line driver 142a, a word line driver 144a, and a ground selection line driver 146a. The string selection line driver 142a may apply one of a selection voltage V_ON and a non-selection voltage V_OFF to each of the string selection lines SSL based on the row address X_ADDR. The word line driver 144a may apply a word line driving voltage V_WL to each of the word lines WL based on the row address X_ADDR. The ground selection line driver 146a may apply one of a selection voltage V_ON and a non-selection voltage V_OFF to each of the ground selection lines GSL.

According to an exemplary embodiment, a memory device 100a may include a string selection line connection SSL_PX configured to electrically connect both ends of each of the string selection lines SSL and a ground selection line connection GSL_PX configured to electrically connect both ends of each of the ground selection lines GSL. Each of the string selection line connection SSL_PX and the ground selection line connection GSL_PX may include a plurality of conductive lines, which need not be connected to transistors. Thus, each of the string selection line connection SSL_PX and the ground selection line connection GSL_PX may form a relatively low capacitance. Also, the selection voltage V_ON or the non-selection voltage V_OFF applied by the string selection line driver 142a and the ground selection line driver 146a may be rapidly transmitted by the string selection line connection SSL_PX and the ground selection line connection GSL_PX. As a result, the selection voltage V_ON or the non-selection voltage V_OFF may be substantially simultaneously applied to both ends of each of the string selection lines SSL and the ground selection lines GSL.

In an exemplary embodiment, the string selection line connection SSL_PX and the ground selection line connection GSL_PX may be formed in a form of a patterned conductive line.

Referring to FIGS. 3 and 14B, a row decoder 140b may receive a word line driving voltage V_WL, a selection voltage V_ON, and a non-selection voltage V_OFF from the voltage generator 130, and receive a row address X_ADDR from the control logic 120. In FIG. 14B, the row decoder 140b may include first and second string selection line drivers 142b_1 and 142b_2, a word line driver 144b, and first and second ground selection line drivers 146b_1 and 146b_2.

The first and second string selection line drivers 142b_1 and 142b_2 may be respectively disposed at opposite sides of a memory cell array 110b and respectively connected to both ends of the string selection lines SSL. The first and second string selection line drivers 142b_1 and 142b_2 each may receive a selection voltage V_ON, a non-selection voltage V_OFF, and a row address X_ADDR and substantially simultaneously apply the selection voltages V_ON or the non-selection voltages V_OFF to the string selection lines SSL in response to the row address X_ADDR.

In addition, the first and second ground selection line drivers 146b_1 and 146b_2 may be respectively disposed at opposite sides of the memory cell array 110b and respectively connected to both ends of the ground selection lines GSL. The first and second ground selection line drivers 146b_1 and 146b_2 each may substantially simultaneously apply the selection voltages V_ON or the non-selection voltages V_OFF to the ground selection lines GSL in response to the row address X_ADDR.

Figure 15:
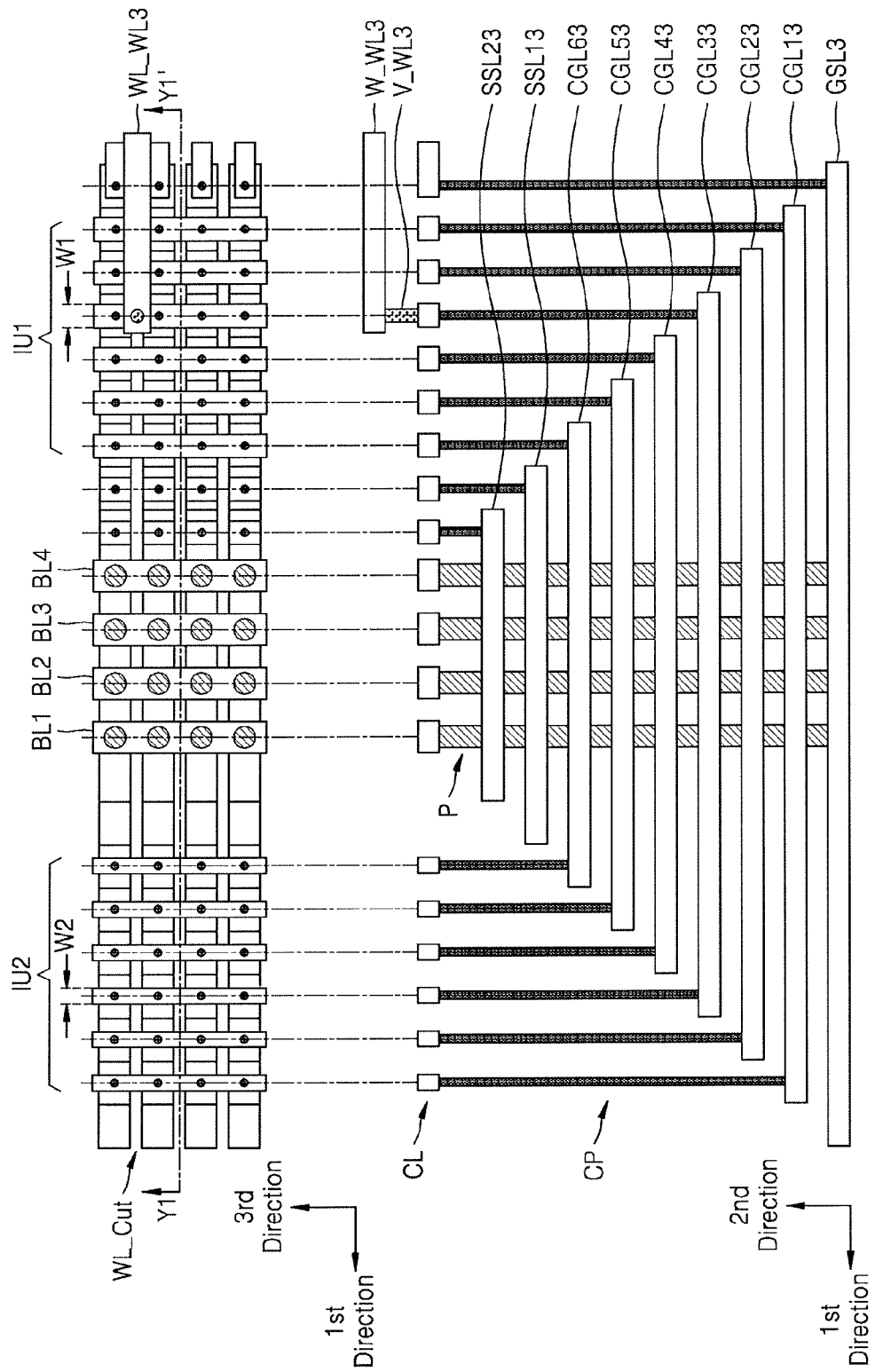
FIG. 15 is a schematic diagram of a structure of the first memory block of FIG. 12A, according to an exemplary embodiment of the present inventive concept.

FIG. 15 is a schematic diagram of a configuration of the first memory block BLK1a of FIG. 12A, according to an exemplary embodiment. For example, an upper portion of FIG. 15 shows a plan view of the first memory block BLK1a, and a lower portion of FIG. 15 shows a schematic cross-sectional view taken along line Y1-Y1' of the plan view. FIG. 15 is greatly simplified for illustrative purpose and is not necessarily to scale.

Referring to FIG. 15, a plurality of pillars P may be formed under bit lines BL1 to BL4. Each of the pillars P may penetrate two string selection lines (e.g., SSL13 and SSL23 in the lower portion of FIG. 15), six cell gate lines (e.g., CGL13 to CGL63 in the lower portion of FIG. 15), and one ground selection line (e.g., GSL3 in the lower portion of FIG. 15). String selection lines SSL, cell gate lines CGL, and ground selection lines GSL arranged at the same level may be isolated (i.e., insulated) from one another by word line cuts WL_Cut.

The string selection lines SSL, the cell gate lines CGL, and the ground selection lines GSL may be formed in a staircase form as shown in the lower portion of FIG. 15 and connected to contacts (or contact plugs) CP extending in a second direction to receive signals applied by the row decoder 140. For example, a cell gate line CGL33 may be electrically connected to a conductive line CL through the contact CP and electrically connected to a wire W_WL3 through a via V_WL3 formed on the conductive line CL. The wire W_WL3 may be electrically connected to the row decoder 140, and the row decoder 140 may apply a voltage to be applied to the cell gate line CGL33 (i.e., a word line driving voltage to be applied to a third word line WL3) to the wire W_WL3. The conductive line CL and the wire W_WL3 may be metal interconnections formed in different layers.

Referring to FIG. 15, each of first interconnection units IU1 configured to electrically connect a plurality of cell gate lines CGL in a region near the row decoder 140 may include a plurality of contacts CP and a wire CL configured to electrically connect the contacts CP to each other. Similarly, each of second interconnection units IU2 spaced apart from the first interconnection units IU1 and configured to electrically connect the plurality of cell gate lines CGL may include a plurality of contacts CP and a wire CL configured to electrically connect the contacts CP to each other. As described above, since a via is formed on the wire CL of the first interconnection unit IU1, a width WL1 of the wire CL included in each of the first interconnection units IU1 may be greater than a width W2 of the wire CL included in each of the second interconnection units IU2 (i.e., W1>W2). When the width W2 of the wire CL included in each of the second interconnection units IU2 is less than the width W1 of the wire CL included in each of the first interconnection units IU1, different patterns may be easily formed in layers in which the wires CL are formed.

According to an exemplary embodiment, the row decoder 140 may be disposed adjacent to one side of the first memory block BLK1a or disposed perpendicular to the first memory block BLK1a. For example, in FIG. 15, the row decoder 140 may be disposed adjacent to a side surface of the first memory block BLK1a in a first direction. Alternatively, in FIG. 15, the row decoder 140 may be disposed adjacent to a substrate of the first memory block BLK1a in a second direction. When the row decoder 140 is disposed adjacent to the substrate of the first memory block BLK1a, the row decoder 140 and the first interconnection unit IU1 may be electrically connected through, for example, through-silicon vias (TSVs).

Figure 16:
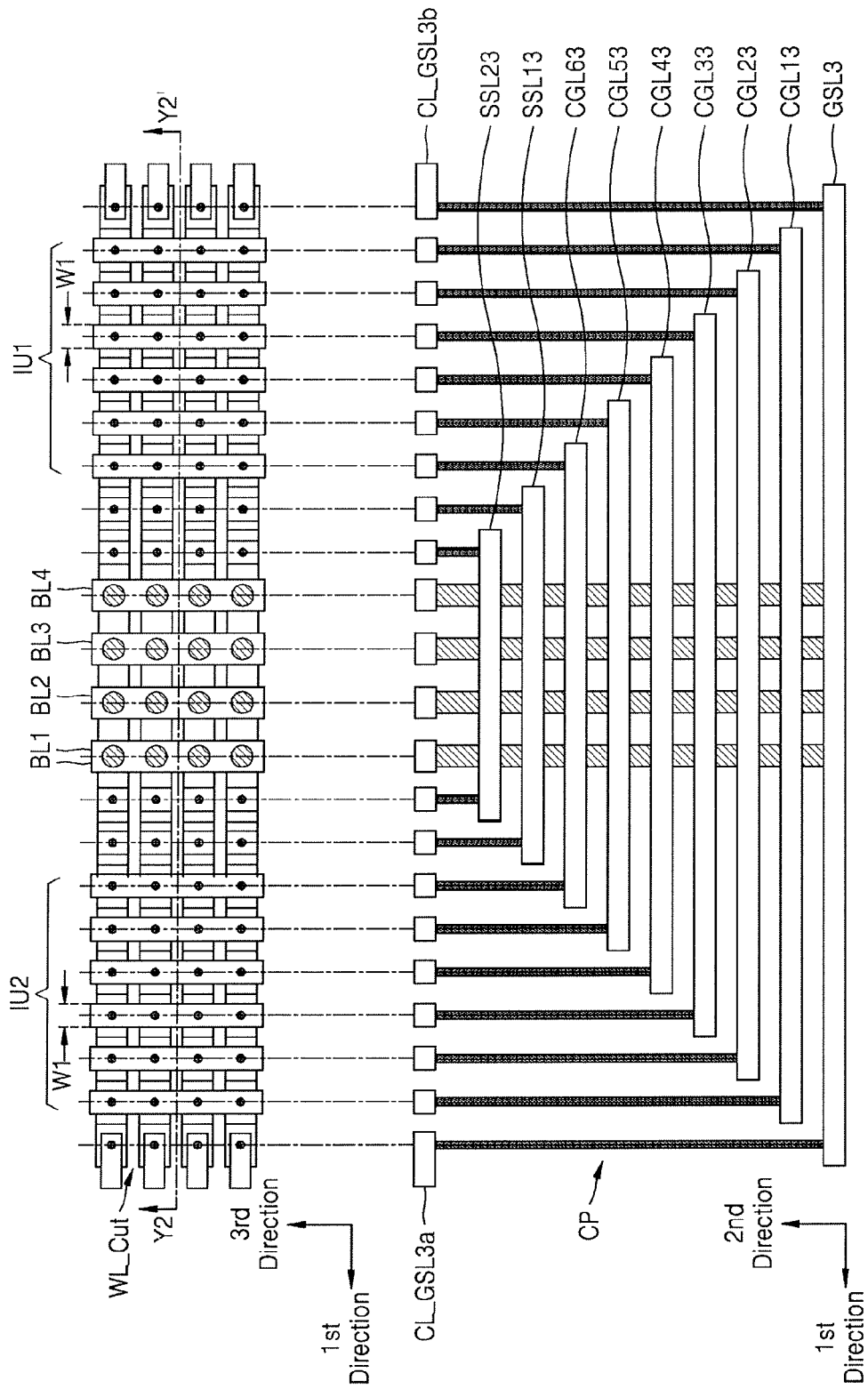
FIG. 16 is a schematic diagram of a structure of the first memory block of FIG. 13, according to an exemplary embodiment of the present inventive concept.

FIG. 16 is a schematic diagram of a structure of the first memory block BLK1e of FIG. 13, according to an exemplary embodiment. For example, a lower portion of FIG. 16 illustrates a schematic cross-sectional view taken along line Y2-Y2' of a plan view of the first memory block BLK1e, which is illustrated in an upper portion of FIG. 16. FIG. 16 is not necessarily to scale, and descriptions of the same elements as in FIG. 15 will be omitted.

As compared with the first memory block BLK1a shown in FIG. 15, in the first memory block BLK1e shown in FIG. 16, both ends of each of string selection lines SSL1 and SSL2 and ground selection lines GSL may be electrically connected to contacts CP and conductive lines CL. For example, referring to the cross-sectional view of the lower portion of FIG. 16, both ends of a ground selection line GSL3 may be connected to two contacts CP, which may be respectively connected to two wire lines CL_GSL3a and CL_GSL3b. As described above with reference to FIG. 13, a selection voltage V_ON or a non-selection voltage V_OFF provided by the row decoder 140 may be applied to the both ends of the ground selection line GSL3 through the two wire lines CL_GSL3a and CL_GSL3b.

Figure 17A:
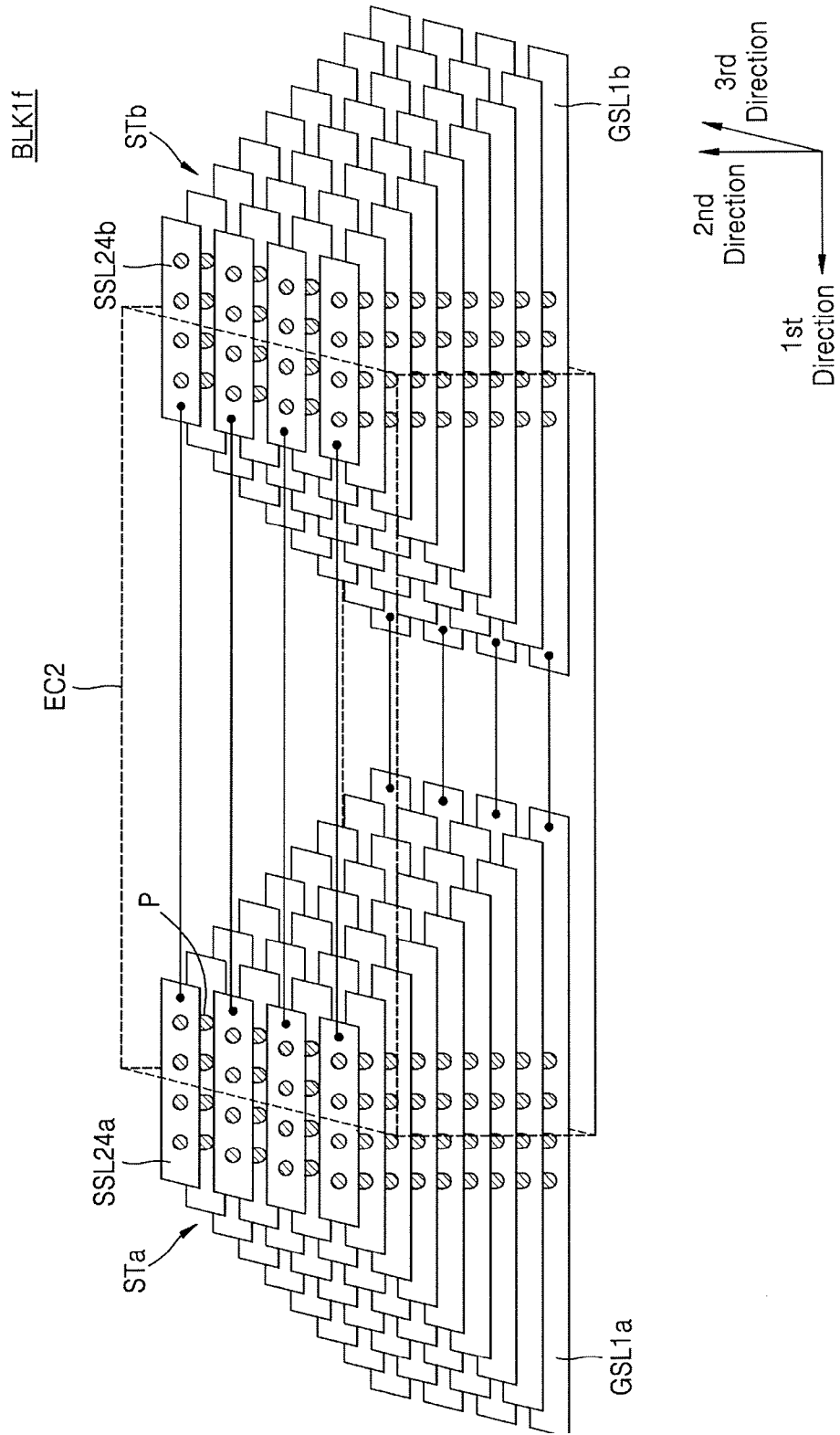
FIGS. 17A and 17B are schematic diagrams of structures of a first memory block according to an exemplary embodiment of the present inventive concept.
Figure 17B:
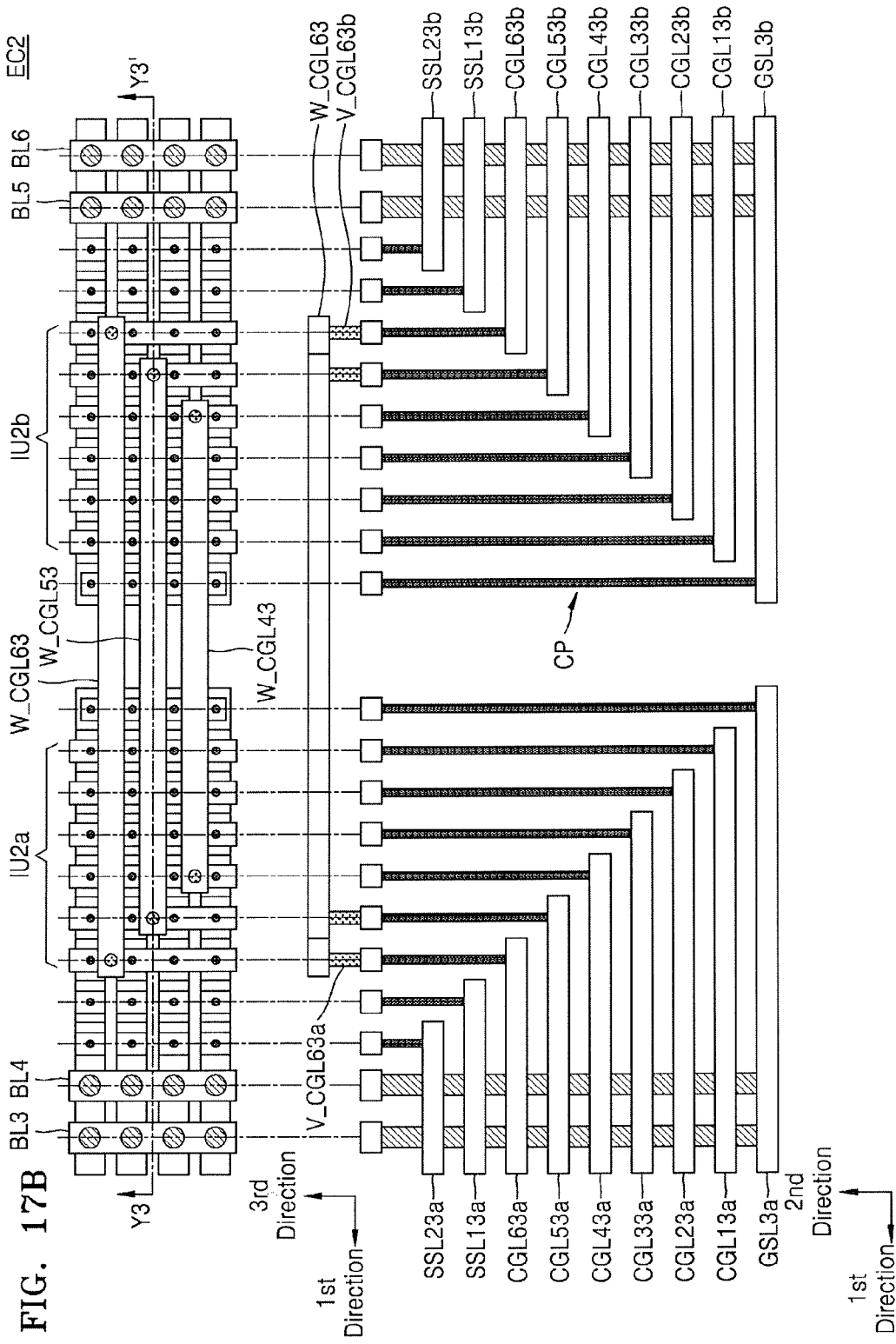

FIGS. 17A and 17B are schematic diagrams of structures of a first memory block BLK1f according to an exemplary embodiment. For example, FIG. 17A is a perspective view of the first memory block BLK1f, and FIG. 17B illustrates a plan view of a portion EC2 of the perspective view of FIG. 17A and a cross-sectional view taken along line Y3-Y3' of the plan view.

Referring to FIG. 17A, the first memory block BLK1f may include two stacks STa and STb formed by stacking string selection lines SSL, cell gate lines CGL, and ground selection lines GSL that are penetrated by a plurality of pillars P. As shown in FIG. 17A, string selection lines (e.g., SSL24a and SSL24b) corresponding to each other, from among gate lines arranged at the same level in the two stacks STa and STb, may be electrically connected to each other. Ground selection lines (e.g., GSL1a and GSL1b) corresponding to each other, from among the gate lines arranged at the same level in the two stacks STa and STb, may be electrically connected to each other. Although FIG. 17A illustrates a case in which the string selection lines SSL and the ground selection lines GSL are connected to each other for brevity, cell gate lines CGL corresponding to each other at the same level may be electrically connected to each other.

Referring to FIG. 17B, cell gate lines arranged at the same level in each of the stacks STa and STb may be electrically connected to each other. For example, as shown in FIG. 17B, cell gate lines arranged at the same level in the stack STa may be electrically connected by interconnection units IU2a, and cell gate lines arranged at the same level in the stack STb may be electrically connected by interconnection units IU2b. Vias may be formed on the interconnection units IU2a and IU2b of the stacks STa and STb), and wires may be formed to connect the vias. For instance, two cell gate lines CGL63a and CGL63b may be electrically connected to contacts CP corresponding thereto by the interconnection units IU2a and IU2b, two vias V_CGL63a and V_CGL63b, and a wire W_CGL63.

Although FIG. 17B illustrates three wires W_CGL43 to W_CGL63 for brevity, additional wires may be disposed to electrically connect string selection lines SSL, cell gate lines CGL, and ground selection lines GSL arranged at the same level and corresponding to one another.

The interconnection units IU2a and IU2b may electrically connect cell gate lines arranged at the same level so that a plurality of paths may be formed between the row decoder 140 and cell transistors. Thus, as described above, a time taken for a signal provided by the row decoder 140 to reach the cell transistor may be reduced.

According to an exemplary embodiment, unlike shown in FIGS. 17A and 17B, stacks may be disposed adjacent to each other in a second direction. For example, the stacks may be stacked in the second direction, which is a direction in which cell gate lines and selection lines are stacked. The stacks may be symmetrical with respect to a plane formed by a first direction and a third direction to share bit lines between the stacks. For example, the stacks may share the bit lines therebetween, and the corresponding string selection lines, cell gate lines, and ground selection lines of the respective stacks may be electrically connected. Interconnection units may be disposed at a point where the corresponding cell gate lines of the respective stacks are connected, and a plurality of cell gate lines corresponding to the same word line may be electrically connected to one another.

Figure 18:
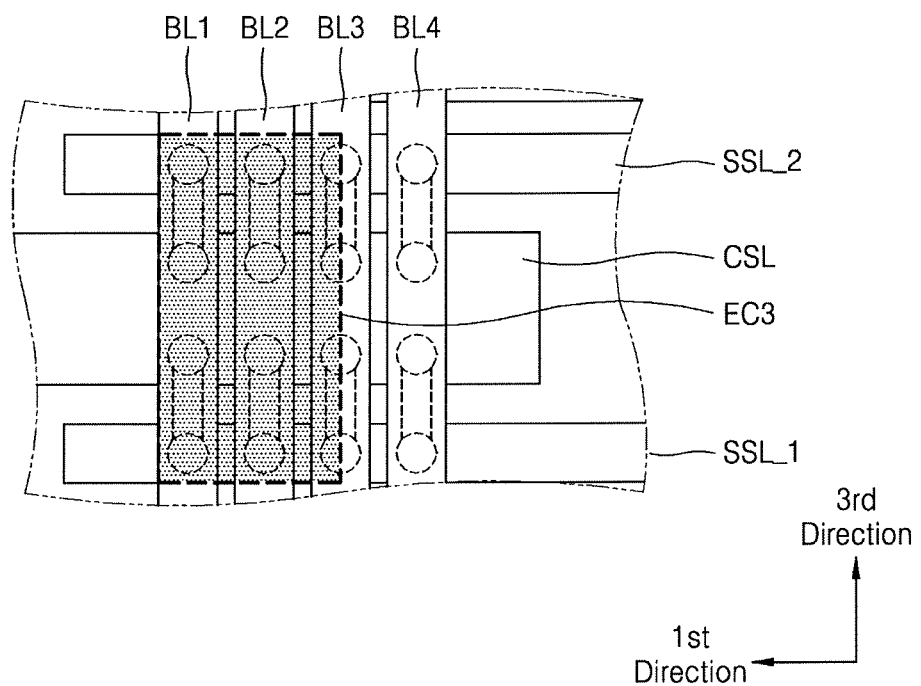
FIG. 18 is a plan view of a portion of a first memory block, which is one of the memory blocks of FIG. 4, according to an exemplary embodiment of the present inventive concept.
Figure 19:
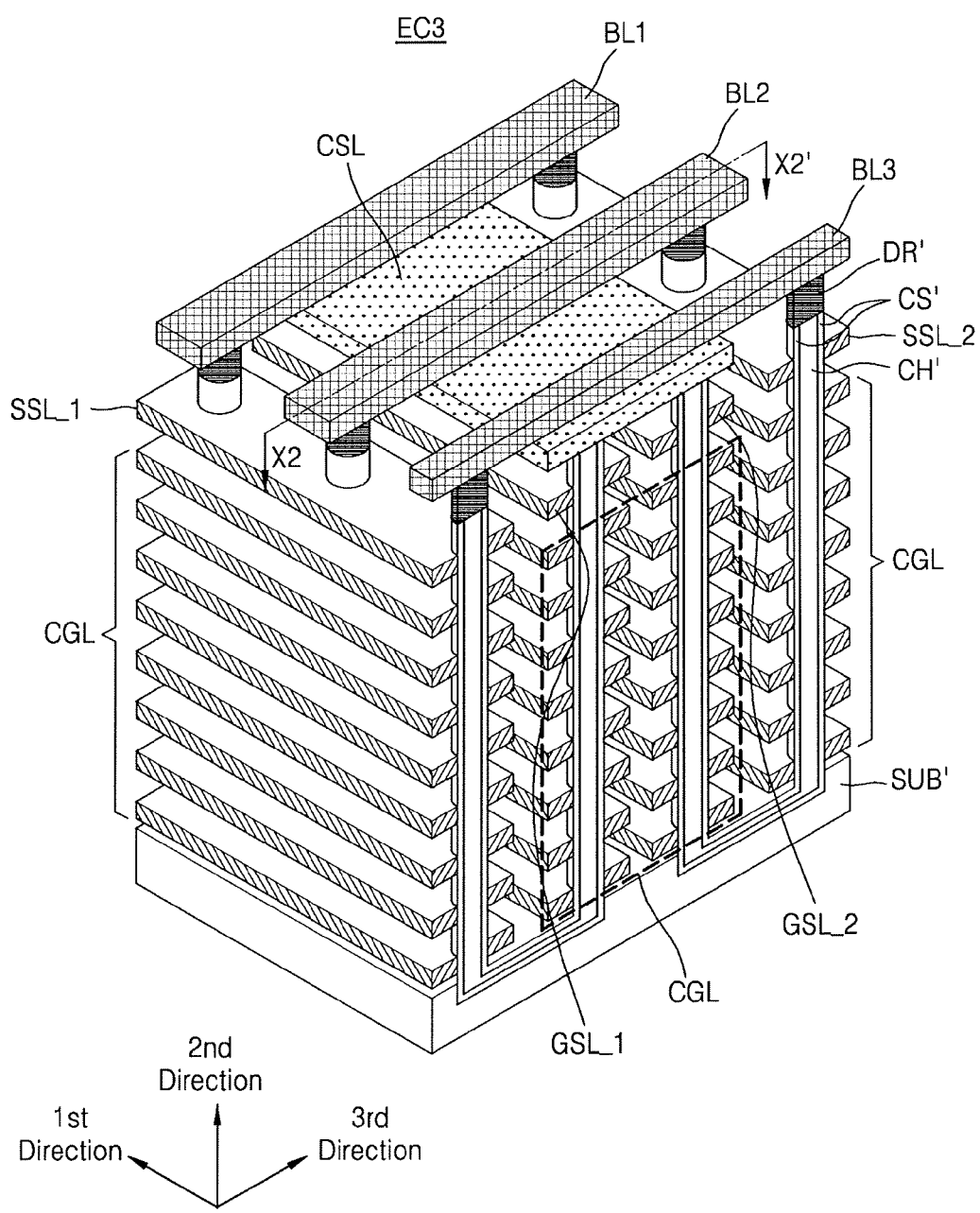
FIG. 19 is a perspective view of a portion of the plan view of FIG. 18 according to an exemplary embodiment of the present inventive concept.
Figure 20:
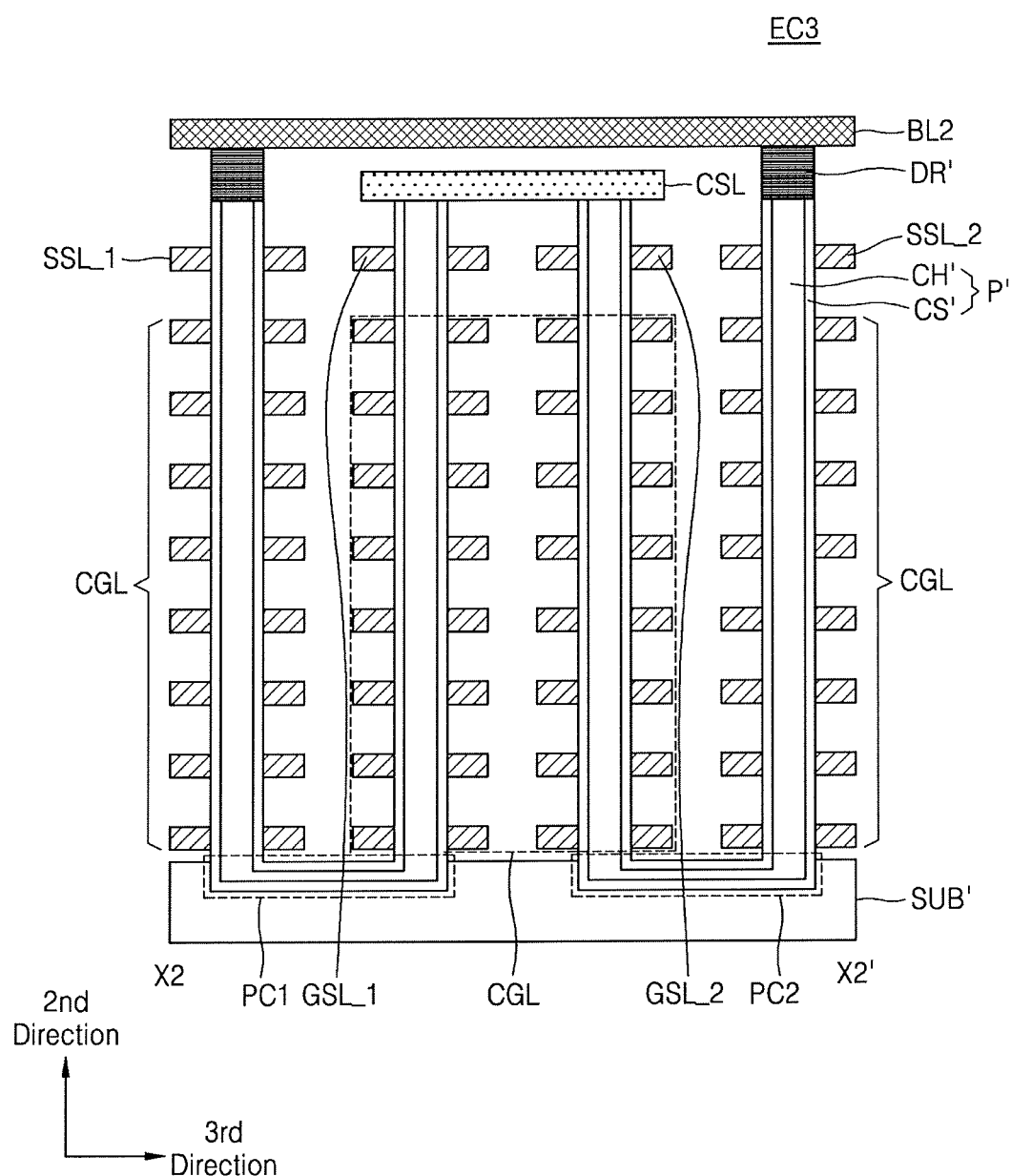
FIG. 20 is a cross-sectional view taken along line X2-X2' of FIG. 19 according to an exemplary embodiment of the present inventive concept.

FIG. 18 is a plan view of a portion of a first memory block BLK1', which is one of the memory block BLK1 to BLKi of FIG. 4, according to an exemplary embodiment. FIG. 19 is a perspective view of a portion EC3 of the plan view of FIG. 18, and FIG. 20 is a cross-sectional view taken along line X2-X2' of FIG. 19. The first memory block BLK1' of FIGS. 18 to 20 may have a different vertical structure from the first memory block BLK1 of FIGS. 5 to 7.

Referring to FIGS. 18 to 20, string selection lines SSL_1 and SSL_2, cell gate lines CGL, and ground selection lines GSL_1 and GSL_2 may be formed of conductive materials on a substrate SUB' and extend in a first direction. Also, a plurality of bit lines BL1 to BL4 may be arranged and extend in a third direction.

A plurality of pillars P' may be formed through the string selection lines SSL_1 and SSL_2, the cell gate lines CGL, and the ground selection lines GSL_1 and GSL_2 and contact the substrate SUB' in a direction perpendicular to the substrate SUB'. The plurality of pillars P' may include charge storage layers CS' and channel layers CH'. The charge storage layers CS' may include an intrinsic semiconductor, and the channel layers CH' may have the same conductivity type as the substrate SUB'.

A plurality of pipeline contacts PC1 and PC2 may be formed on the substrate SUB'. The pipeline contacts PC1 and PC2 may extend in a direction of the bit lines BL1 to BL4, and connect a pair of pillars P' adjacent to each other in the third direction. The pipeline contacts PC1 and PC2 may include channel layers CH' and charge storage layers CS' and connect the channel layers CH' and the charge storage layers CS' of a pair of adjacent pillars P' to each other.

A common source line CSL may be disposed on one of a pair of pillars P' and extend in the first direction. The common source line CSL may include a metal material and have a different conductivity type from the substrate SUB'. Drains DR' may be disposed on the other one of the pair of pillars P'. The drains DR' may have a different conductivity type from the substrate SUB', and bit lines BL1 to BL4 may be arranged on the drains DR'. A pair of pillars connected through one pipeline contact may constitute one cell string along with the string selection lines SSL_1 and SSL_2, the cell gate lines CGL, and the ground selection lines GSL_1 and GSL_2 that are stacked.

Figure 21:
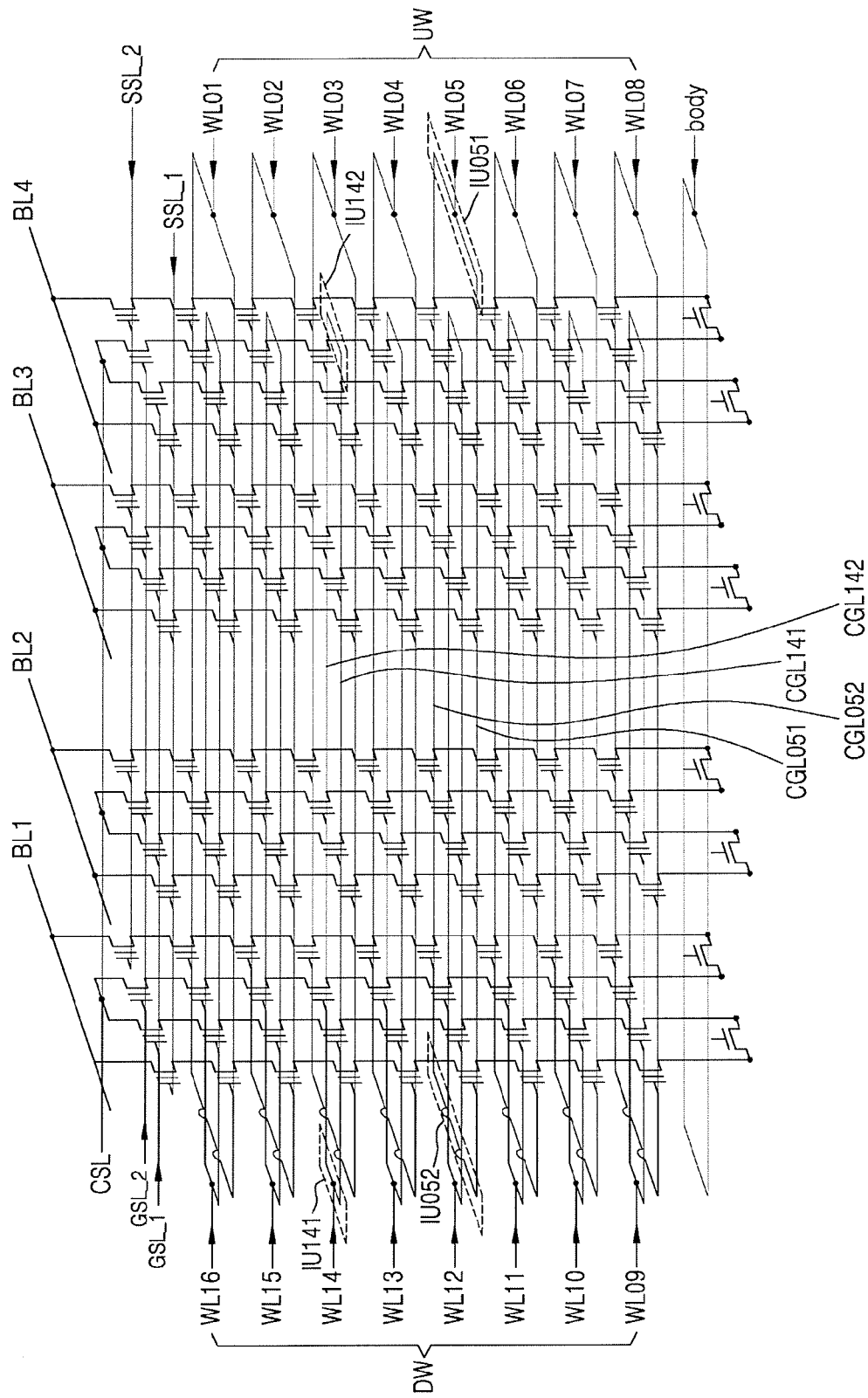
FIG. 21 is an equivalent circuit diagram of the first memory block of FIG. 18 according to an exemplary embodiment of the present inventive concept.

FIG. 21 is an equivalent circuit diagram of the first memory block BLK1' of FIG. 18. A string included in the first memory block BLK1' of FIG. 21 may include one string selection transistor, sixteenth cell transistors, and one ground selection transistor. In FIG. 21, arrows indicate directions in which signals provided by the row decoder 140 are transmitted.

Referring to FIG. 21, the first memory block BLK1' may include a plurality of strings. A plurality of word lines (e.g., WL01 to WL16), a plurality of bit lines (e.g., BL1 to BL4), ground selection lines (e.g., GSL_1 and GSL_2), string selection lines (e.g., SSL_1 and SSL_2), a common source line CSL, and a body line may be disposed.

Each of the word lines WL01 to WL16 may include two cell gate lines, a first interconnection unit configured to transmit a signal received from the row decoder 140 to the two cell gate lines, and a second interconnection unit disposed apart from the first interconnection unit. For example, the fifth word line WL05 may include two cell gate lines CGL051 and CGL052, a first interconnection unit IU051, and a second interconnection unit IU052. Also, the fourteenth word line WL14 may include two cell gate lines CGL141 and CGL142, a first interconnection unit IU141, and a second interconnection unit IU142. Thus, the first memory block BLK1' may include a cell transistor configured to receive a signal provided by the row decoder 140 through at least two paths.

The first memory block BLK1' may include a cell transistor configured to receive a signal (e.g., a read voltage or a pass voltage) provided by the row decoder 140 through the second interconnection unit faster than the first interconnection unit. Thus, a time taken for the signal to be transmitted to the cell transistor included in the first memory block BLK1' may be reduced, thereby increasing an operating speed of the memory device 100. Also, since the cell transistor is electrically connected to the row decoder 140 through at least two paths, even if failures occurs, for example, even if a portion of a word line (e.g., a cell gate line) is cut or a resistance of the word line becomes high, the cell transistor may receive signal from the row decoder 140 through a different path from a path in which failures occur. Thus, a failure rate of the memory device 100 may be reduced.

Figure 22:
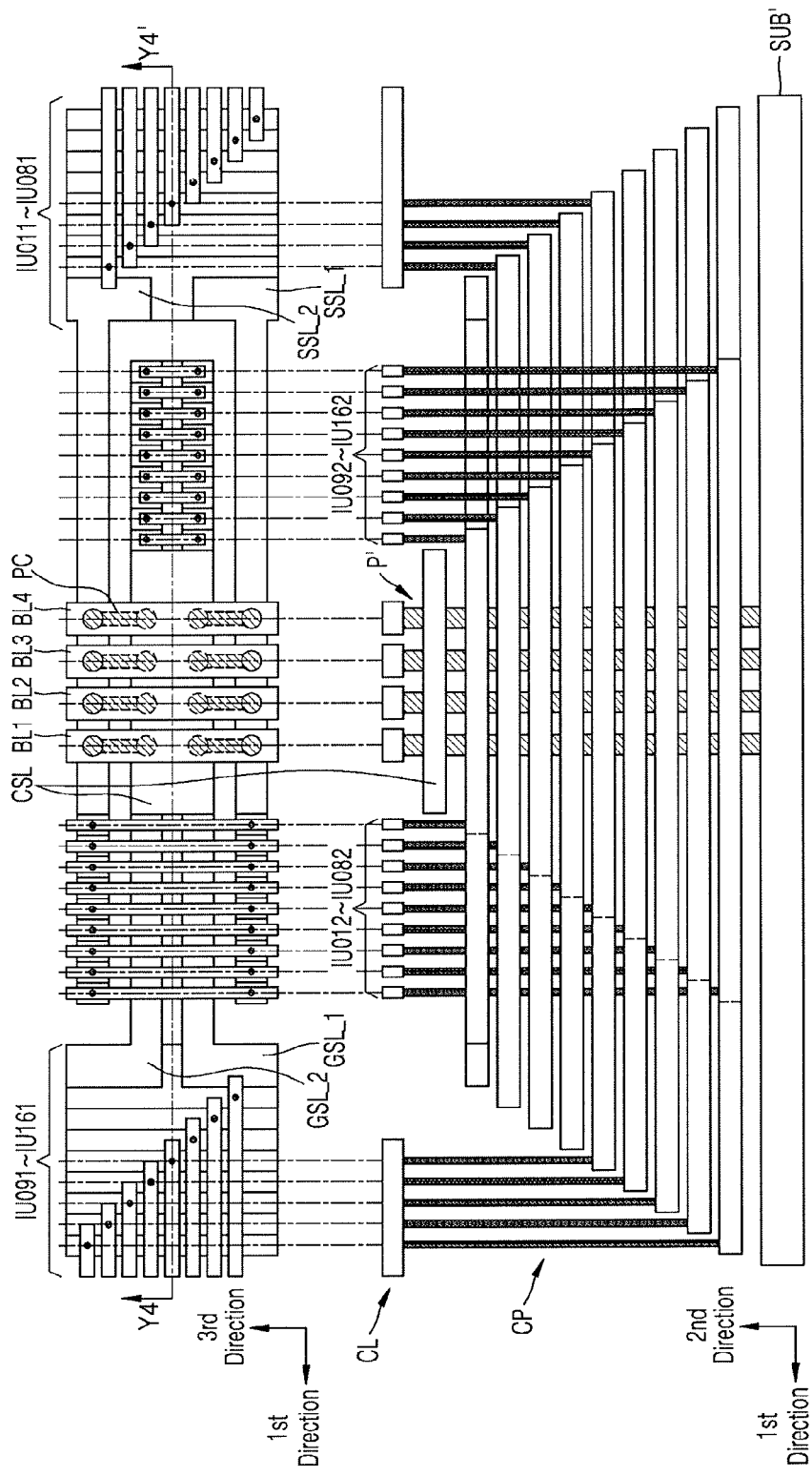
FIG. 22 is a schematic diagram of a structure of the first memory block of FIG. 21, according to an exemplary embodiment of the present inventive concept.

FIG. 22 is a schematic diagram of a structure of the first memory block BLK1' of FIG. 21, according to an exemplary embodiment. For example, an upper portion of FIG. 22 shows a plan view of the first memory block BLK1', and a lower portion of FIG. 22 shows a schematic cross-sectional view taken along a line Y4-Y4' of the plan view. FIG. 22 is greatly simplified for illustrative purpose and is not necessarily to scale.

Referring to FIG. 22, a plurality of pillars P' may be formed under bit lines BL1 to BL4. A pair of pillars P', which are adjacent to each other in a third direction, and a pipeline contact PC configured to connect the pair of pillars P' may constitute one string. String selection lines SSL_1 and SSL_2 and ground selection lines GSL_1 and GSL_2 may extend in a first direction and be arranged at the same level. Also, a plurality of cell gate lines constituting each of two word lines may be arranged at one level. Cell gate lines, which constitute the same word line from among cell gate lines arranged at one level, may be electrically connected through the first and second interconnection units.

First interconnection units IU011 to IU181 and IU091 to IU161 may be formed at the same level as cell gate lines corresponding respectively thereto. For example, cell gate lines, which may constitute the same word line, and the first interconnection unit configured to connect the cell gate lines may be patterned in one layer. The first interconnection units IU011 to IU181 and IU091 to IU161 may be formed in a staircase form as shown in the lower portion of FIG. 22 and connected to contacts extending in a second direction to receive signals applied by the row decoder 140.

Second interconnection units IU012 to IU082 and IU092 to IU162 may be formed inward from the first interconnection units IU011 to IU181, IU091 to IU161 and include contacts and conductive lines. The cell gate lines may be formed in a staircase form as shown in the lower portion of FIG. 22 and connected to the contacts of the second interconnection units IU012 to IU082 and IU092 to IU162.

Figure 23:
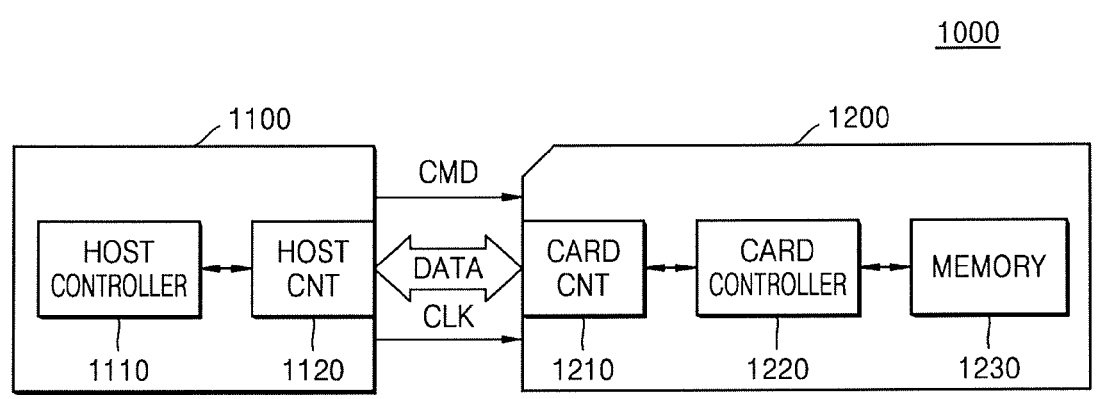
FIG. 23 is a block diagram of a memory card system including a memory device according to an exemplary embodiment of the present inventive concept.

FIG. 23 is a block diagram of an example of applying a memory system including a memory device according to an exemplary embodiment to a memory card system 1000. Referring to FIG. 23, the memory card system 1000 may include a host 1100 and a memory card 1200.

The host 1100 may include a host controller 1110 and a host connector 1120. The memory card 1200 may include a card connector 1210, a card controller 1220, and a memory device 1230. In this case, the memory device 1230 included in the memory card 1200 may be embodied by using the embodiments shown in FIGS. 1 to 22. In some embodiments, an operating speed of the memory device 1230 may be improved so that a time taken for the memory card 1100 to respond to a request of the host 1100 may be reduced. Also, a failure rate of the memory device 1230 may be reduced so that a failure rate of the memory card 1200 may also be reduced.

The host 1100 may store data in the memory card 1200 or read the data stored in the memory card 1200. The host controller 1110 may transmit a command CMD, a clock signal CLK generated by a clock generator (not shown) of the host 1100, and data DATA via the host connector 1120 to the memory card 1200.

The card controller 1220 may store data in the memory device 1230 in synchronization with the clock signal generated by a clock generator (not shown) included in the card controller 1220, in response to a command received through the card connector 1210. The memory device 1230 may store data transmitted by the host 1100.

The memory card 1200 may be embodied by a compact flash card (CFC), a microdrive, a smart media card (SMC), a multimedia card (MMC), a secure digital card (SDC), a memory stick, and/or a USB flash memory driver.

Figure 24:
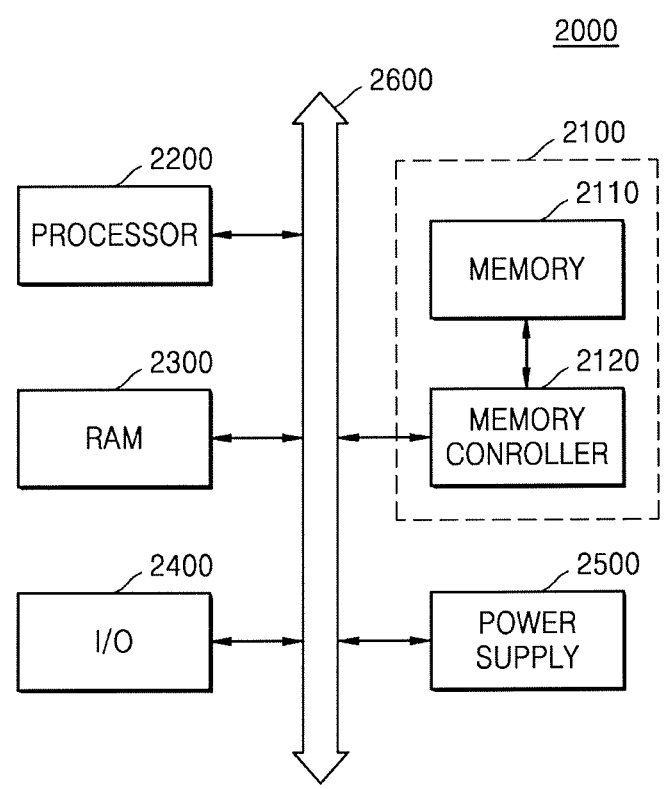
FIG. 24 is a block diagram of a computing system including a memory device according to an exemplary embodiment of the present inventive concept.

FIG. 24 is a block diagram of a computing system 2000 including a memory device 2100 according to an exemplary embodiment. Referring to FIG. 24, the computing system 2000 may include a memory system 2100, a processor 2200, a RAM 2300, an I/O device 2400, and a power supply 2500. Although not shown in FIG. 24, the computing system 2000 may communicate with a video card, a sound card, a memory card, and a USB device or further include ports capable of communicating with other electronic devices. The computing system 2000 may be embodied by a personal computer (PC) or a portable electronic device, such as a laptop computer, a portable phone, a personal digital assistant (PDA), and a camera.

The processor 2200 may make calculations or perform tasks. In some embodiments, the processor 2200 may be a microprocessor (MP) or a central processing unit (CPU). The processor 2200 may communicate with the RAM 2300, the I/O device 2400, and the memory system 2100 through a bus, such as an address bus, a control bus, and a data bus. The processor 2200 may be connected to an expansion bus, such as a peripheral component interconnect (PCI) bus.

The memory system 2100 may include a memory device 2110 embodied by the embodiments shown in FIGS. 1 to 22. In some embodiments, an operating speed of the memory device 1230 may be improved so that a time taken for the memory system 2100 to respond to a request received from the processor 2220 may be reduced. Also, a reduction in failure rate of the memory device 2110 may lead to reductions in failure rates of the memory system 2100 and the computing system 2000.

The RAM 2300 may store data required for an operation of the computing system 2000. For example, the RAM 2300 may be dynamic RAM (DRAM), mobile DRAM, static RAM (SRAM), phase-change RAM (PRAM), ferroelectric RAM (FRAM), resistive RAM (RRAM), and/or magnetic RAM (MRAM).

The I/O device 2400 may include an input unit, such as a keyboard, a keypad, or a mouse, and an output unit, such as a printer or a display. The power supply 2500 may supply an operating voltage required for an operation of the computing system 2000.

Figure 25:
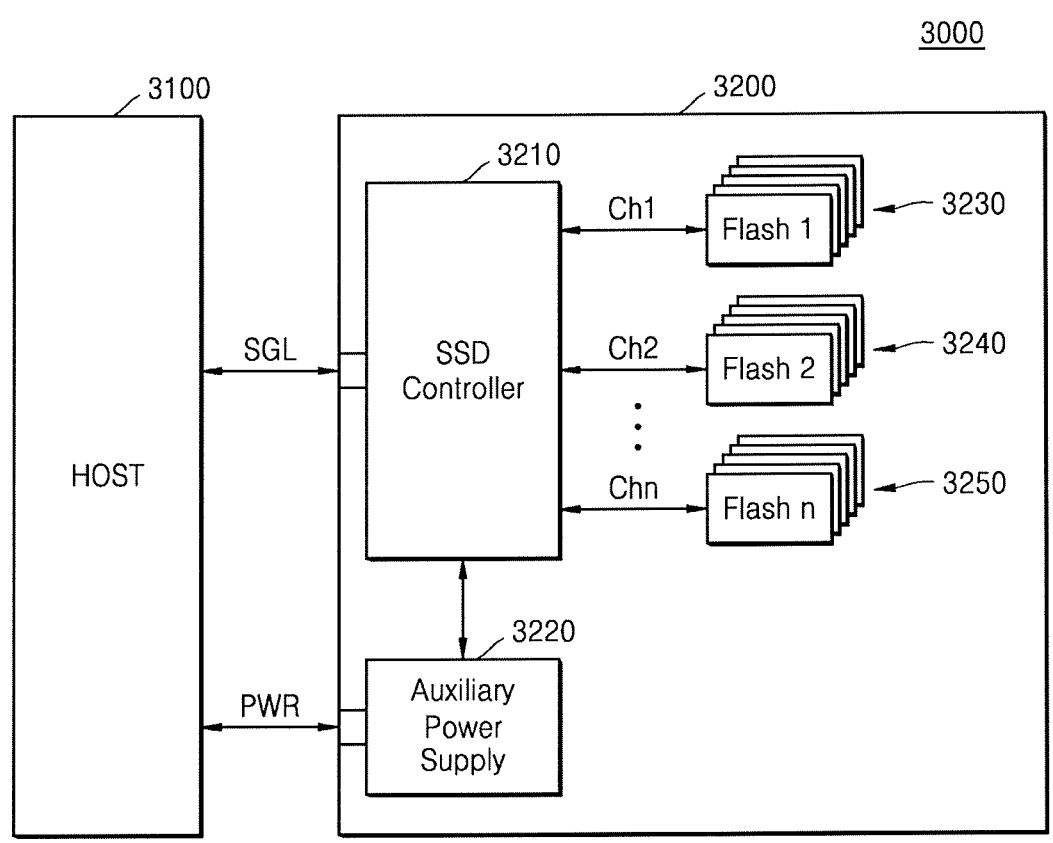
FIG. 25 is a block diagram of a solid-state drive (SSD) system including a memory device according to an exemplary embodiment of the present inventive concept.

FIG. 25 is a block diagram of a solid-state drive (SSD) system 3000 including a memory device according to an exemplary embodiment. Referring to FIG. 25, the SSD system 3000 may include a host 3100 and an SSD 3200. The SSD 3200 may exchange signals with the host 3100 through a signal connector, and receive power through a power connector. The SSD 3200 may include an SSD controller 3210, an auxiliary power supply 3220, and a plurality of memory devices (e.g., memory devices 3230, 3240, and 3250). The memory devices 3230, 3240, and 3250 may be vertical NAND (VNAND) flash memory devices according to an exemplary embodiment.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A memory device comprising:
a memory cell array including a plurality of strings including a first string and a second string, each string including a string selection transistor, a ground selection transistor and a plurality of cell transistors vertically stacked on a substrate;
first and second ground selection lines connected to a gate of a first ground selection transistor of the first string and a gate of a second ground selection transistor of the second string, respectively, the first and the second ground selection lines being electrically insulated from each other and independently controlled;
first and second cell gate lines connected to a gate of a first cell transistor of the first string and a gate of a second cell transistor of the second string, respectively;
a first interconnection unit having a first patterned conducive layer, the first interconnection unit electrically connecting a first portion of the first cell gate line and to a first portion of the second cell gate line; and
a second interconnection unit having a second patterned conducive layer, the second interconnection unit electrically connecting a second portion of the first cell gate line to a second portion of the second cell gate line.

2. The memory device of claim 1, further comprising:
a common source line connected to sources of the first and the second ground selection transistors; and
a first ground selection line driver electrically connected to a first end of the first ground selection line and a first end of the second ground selection line,
wherein the first ground selection line driver applies a selection voltage to one of the first ground selection line and the second selection line and applies a non-selection voltage to the other.

3. The memory device of claim 2, further comprising:
a second ground selection line driver electrically connected to a second end of the first ground selection line and a second end of the second ground selection line,
wherein the second ground selection line driver applies a same voltage as a voltage applied by the first ground selection line driver to each of the first and the second ground selection lines.

4. The memory device of claim 3, further comprising:
a first ground selection line connection electrically connecting the first and the second ends of the first ground selection line.

5. The memory device of claim 2,
wherein if a cell transistor of the first string is read, the first ground selection driver applies the selection voltage to the first ground selection line and applies the non-selection voltage to the second ground selection line.

6. The memory device of claim 1,
wherein the string selection transistor has a drain connected to one of a plurality of bit lines arranged in the memory cell array, and
wherein the memory device further comprises:
first and second string selection lines connected to a gate of a first string selection transistor of the first string and a gate of a second string selection transistor of the second string, respectively; and
a first string selection line driver electrically connected to a first end of the first string selection line and a first end of the second string selection line,
wherein the first string selection line driver applies a selection voltage to one of the first string selection line and the second string selection line and applies a non-selection voltage to the other.

7. The memory device of claim 6, further comprising:
a second string selection line driver electrically connected to a second end of the first string selection line and a second end of the second string selection line,
wherein the second string selection line applies a same voltage as a voltage applied by the first string selection line driver to the first and the second string selection lines.

8. The memory device of claim 6, further comprising:
a string selection line connection electrically connecting the first end of the first string selection line to the second end of the first string selection line.

9. The memory device of claim 1,
wherein the cell transistors of each string are connected in series to each other, and
wherein each string further includes at least one dummy cell transistor disposed between a lowermost cell transistor of the cell transistors vertically stacked and the ground selection transistor or between a topmost cell transistor of the cell transistor vertically stacked and the string selection transistor.

10. The memory device of claim 1, further comprising:
a plurality of cell gate lines including the first and the second cell gate lines, wherein each of the cell gate lines is connected to cell transistors disposed in a same level;
a word line driver electrically connected to the first interconnection unit and applying a word line driving voltage to the first interconnection unit,
wherein each cell gate line is connected to a gate of a corresponding cell transistor, and
wherein the first interconnection unit further connects electrically a first portion of each of the cell gate lines other than the first and the second cell gate lines to the first portion of the first cell gate line.

11. The memory device of claim 10,
wherein the second interconnection unit further connects electrically a second end of each of the cell gate lines other than the first and the second cell gate lines to the second end of the first cell gate line.

12. The memory device of claim 10,
wherein the first interconnection unit further comprises:
a first contact disposed on the first portion of the first cell gate line;
a second contact disposed on the first portion of the second cell gate line; and
a plurality of third contacts, wherein each third contact is disposed on a first portion of a corresponding cell gate line of the cell gate lines other than the first and the second cell gate lines,
wherein the first patterned conductive layer connects the first contact, the second contact and each of the third contacts to each other, and
wherein the first patterned conductive layer is connected to the word line driver.

13. The memory device of claim 12,
wherein a width of the first patterned conductive layer is smaller than a width of the second patterned conductive layer.

14. The memory device of claim 1,
wherein the first and the second cell gate lines are positioned at a first level,
wherein the first level corresponds to a topmost cell transistor of the cell transistors stacked vertically, and
wherein the topmost cell transistor is a cell transistor positioned farthest to the substrate, among the cell transistors.

15. The memory device of claim 1,
wherein the first portion of each of the first and the second cell gate lines is a first end of each of the first and the second cell gate lines, the second portion of each of the first and the second cell gate lines is a second end of each of the first and the second cell gate lines, and the first end is opposite the second end.

16. The memory device of claim 1,
wherein the first portion of each of the first and the second cell gate lines is a first end of each of the first and the second cell gate liens, the second portion of each of the first and the second cell gate lines is a point disposed between the first end and a second end opposite the first end.

17. The memory device of claim 1, further comprising:
a third interconnection unit having a third patterned conducive layer,
wherein the third interconnection unit electrically connects a third portion of the first cell gate line to a third portion of the second cell gate line, and the third portion of the third interconnection unit is disposed between the first and the second portions of the third interconnection unit.

18. A memory device comprising:
a memory cell array including a plurality of strings including a first string and a second string, each string including a string selection transistor, a ground selection transistor and a plurality of cell transistors vertically stacked in at least one levels on a substrate;
first and second ground selection lines connected to a gate of first ground selection transistor of the first string and to a gate of a second ground selection transistor of the second string, respectively, the first and the second ground selection lines being electrically insulated from each other independently controlled; and
a row decoder generating a word line driving voltage and applying a selection voltage to one of the first and the second ground selection lines and applying a non-selection voltage to the other,
wherein the word line driving voltage is transmitted through first and second paths to the cell transistors of each string, and
wherein the cell transistors of each string are disposed at a first level.

19. The memory device of claim 18, further comprising:
first and second cell gate lines connected to gates of the first and the second cell transistors, respectively,
wherein the first path includes a first interconnection unit electrically connecting a first portion of the first cell gate line to a first portion of the second cell gate line, and
wherein the second path includes a second interconnection unit electrically connecting a second portion of the first cell gate line to a second portion of the second cell gate line.

20. The memory device of claim 19,
wherein the row decoder is electrically connected to the first interconnection unit,
wherein the word line driving voltage transmitted to the gate of the first cell transistor through the first path passes through the first interconnection unit and the first cell gate line, and the word line driving voltage transmitted to the gate of the first cell transistor through the second path passes through the first interconnection unit, the second cell gate line, the second interconnection unit, and the first cell gate line.

21. The memory device of claim 20,
wherein a capacitance of the second cell gate line is lower than a capacitance of the first cell gate line.

22. The memory device of claim 18,
wherein if a cell transistor of the first string is read, the row decoder applies the selection voltage to the first ground selection line and applies the non-selection voltage to the second ground selection line.

23. The memory device of claim 18,
wherein the row decoder comprises first and second ground selection line drivers, wherein the first ground selection line driver is electrically connected to first ends of each of the first and the second ground selection lines and the second ground selection line driver is electrically connected to second ends of each of the first and the second ground selection lines, and wherein the first and second ground selection line drivers apply the one of a selection voltage and a non-selection voltage to each of the first and the second ground selection lines.

24. The memory device of claim 18,
wherein the string selection transistor has a drain connected to one of a plurality of bit lines arranged in the memory cell array,
wherein the memory device further comprises:
first and second string selection lines connected to a gate of a first string selection transistor of the first string and a gate of a second string selection transistor of the second string of the second string, respectively, and
wherein the row decoder comprises:
a first string selection line driver electrically connected to a first end of each of the first and the second string selection lines,
wherein the first string selection line driver applies a selection voltage to one of the first and the second string selection lines and applies a non-selection voltage to the other.

25. The memory device of claim 24,
wherein the row decoder further comprises:
a second string selection line driver electrically connected to a second end of each of the first and the second string selection lines,
wherein the second string selection line driver applies a same voltage of the first string selection line driver to the first and the second string selection lines.

26. The memory device of claim 18,
wherein the cell transistors each string are connected in series to each other, and
wherein each string further includes at least one dummy cell transistor disposed between a lowermost cell transistor of the cell transistors vertically stacked and the ground selection transistor or between a topmost cell transistor of the cell transistors vertically stacked and the string selection transistor.

27. A memory device comprising:
a first cell gate line extending along a first direction;
a first ground selection line extending along the first direction;

a first ground selection line connection connecting electrically both ends of the first ground selection line;

a first string selection line extending along the first direction;

a first string selection line connection connecting electrically both ends of the first string selection line; and a row decoder electrically connected to the first cell gate line, the first ground selection line, the first ground selection line connection, the first string selection line and the first string selection line connection, wherein the first ground selection line, the first cell gate line, and the first string selection line are stacked vertically on each other on a substrate.

28. The memory device of claim 27, further comprising:

a second cell gate line extending along the first direction, wherein the first cell gate line and the second cell gate line are positioned at substantially the same height from the substrate; and a first interconnection unit having a first patterned conductive layer, wherein the first connection unit electrically connects a first end of the first cell gate line to a first end of the second cell gate line, and the first patterned conductive layer is extended along a second direction crossing the first direction.

29. The memory device of claim 27, further comprising:

a second string selection line extending along the first direction, wherein the first string selection line and the second string selection line are spaced apart from each other along a second direction crossing the first direction and positioned at substantially the same height from the substrate; and a second string selection line connection connecting electrically both ends of the first string selection line, wherein the row decoder includes a string selection line driver applies a selection voltage to one of the first and the second string selection lines and applies a non-selection voltage to the other.

* * * * *